US012761763B2

(12) United States Patent
Lim

(10) Patent No.: US 12,761,763 B2
(45) Date of Patent: Oct. 13, 2026

(54) DISPLAY DEVICE AND METHOD FOR MANUFACTURING THE SAME

(71) Applicant: SAMSUNG DISPLAY CO., LTD., Yongin-si (KR)

(72) Inventor: Sanghyun Lim, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 19/385,025

(22) Filed: Nov. 10, 2025

(65) Prior Publication Data

US 2026/0064231 A1 Mar. 5, 2026

Related U.S. Application Data

(62) Division of application No. 18/774,755, filed on Jul. 16, 2024, now Pat. No. 12,468,428.

(30) Foreign Application Priority Data

Oct. 20, 2023 (KR) ........................ 10-2023-0141167

(51) Int. Cl.

| | |
|---|---|
| ***G06F 3/044*** | (2006.01) |
| ***G06F 3/041*** | (2006.01) |
| ***H10K 59/12*** | (2023.01) |
| ***H10K 59/40*** | (2023.01) |

(52) U.S. Cl.

CPC .......... *G06F 3/0445* (2019.05); *G06F 3/0412* (2013.01); *G06F 3/0443* (2019.05); *G06F 3/0446* (2019.05); *H10K 59/1201* (2023.02); *H10K 59/40* (2023.02); *G06F 2203/04103* (2013.01); *G06F 2203/04111* (2013.01); *G06F 2203/04112* (2013.01)

(58) Field of Classification Search

CPC ..................... G06F 2203/04111; G06F 3/0445

See application file for complete search history.

(56) References Cited

U.S. PATENT DOCUMENTS

| | | | | |
|---|---|---|---|---|
| 10,983,639 | B2 | 4/2021 | Han et al. | |
| 11,137,862 | B2 * | 10/2021 | Yun | G06F 3/0443 |
| 11,335,749 | B2 | 5/2022 | Kim et al. | |
| 2020/0183541 | A1 * | 6/2020 | Toyooka | G06F 3/0418 |

FOREIGN PATENT DOCUMENTS

| | | |
|---|---|---|
| KR | 10-2017-0115148 A | 10/2017 |
| KR | 10-2018-0076006 A | 7/2018 |
| KR | 10-2482494 B1 | 12/2022 |

* cited by examiner

*Primary Examiner* — Robin J Mishler

(74) *Attorney, Agent, or Firm* — Womble Bond Dickinson (US) LLP

(57) ABSTRACT

A display device includes a display panel and an input sensor. The input sensor may include a first detection pattern, and a first detection electrode including a bridge pattern electrically connected to the first detection pattern. The bridge pattern may include a (1-1)-th conductive layer, and a (1-2)-th conductive layer, and the first detection pattern may include a (2-1)-th conductive layer, and a (2-2)-th conductive layer. A first opening portion that exposes the one surface of the (1-1)-th conductive layer may be defined in the (1-2)-th conductive layer, and a second opening portion that exposes the one surface of the (2-1)-th conductive layer may be defined in the (2-2)-th conductive layer. The one surface of the (1-1)-th conductive layer and the one surface of the (2-1)-th conductive layer may be in contact with each other.

3 Claims, 16 Drawing Sheets

DISPLAY DEVICE AND METHOD FOR MANUFACTURING THE SAME

CROSS-REFERENCE TO RELATED APPLICATIONS

This application is a divisional of U.S. patent application Ser. No. 18/774,755, filed Jul. 16, 2024, which claims priority to and the benefit of Korean Patent Application No. 10-2023-0141167, filed Oct. 20, 2023, the entire content of both of which is incorporated herein by reference.

BACKGROUND

Aspects of some embodiments of the present disclosure herein relate to a display device and a method for manufacturing the same, and for example, to a display device including an input sensor.

Multimedia devices such as televisions, mobile phones, tablet computers, navigation units, and game consoles, include display devices that provide users with images through display screens. The display devices may provide touch-based input schemes that enable the users to input information or commands intuitively and conveniently.

The display devices may include display panels that generate images, and input sensors that detect users' touch inputs. The input sensors may include conductors that detect external inputs.

The above information disclosed in this Background section is only for enhancement of understanding of the background and therefore the information discussed in this Background section does not necessarily constitute prior art.

SUMMARY

Aspects of some embodiments of the present disclosure include a display device in which contact resistance between conductive layers of an input sensor is relatively reduced to relatively improve performance of the input sensor.

Aspects of some embodiments of the present disclosure also include a method for manufacturing a display device with relatively improved performance.

According to some embodiments of the present disclosure, a display device includes: a display panel that includes an emission area and a non-emission area adjacent to the emission area, and an input sensor that includes a detection area and a non-detection area adjacent to the detection area, and is on the display panel. According to some embodiments, the input sensor may include a first detection pattern overlapping the detection area, and a first detection electrode on a different layer from the first detection pattern, and including a bridge pattern electrically connected to the first detection pattern through a contact hole passing through a sensor insulation layer. According to some embodiments, the bridge pattern may include a (1-1)-th conductive layer, and a (1-2)-th conductive layer directly on one surface of the (1-1)-th conductive layer, and the first detection pattern may include a (2-1)-th conductive layer, and a (2-2)-th conductive layer directly on one surface of the (2-1)-th conductive layer. According to some embodiments, a first opening portion that exposes the one surface of the (1-1)-th conductive layer may be defined in the (1-2)-th conductive layer, and a second opening portion that exposes the one surface of the (2-1)-th conductive layer may be defined in the (2-2)-th conductive layer. According to some embodiments, the one surface of the (1-1)-th conductive layer which overlaps the first opening portion and the one surface of the (2-1)-th conductive layer which overlaps the second opening portions, may be in contact with each other.

According to some embodiments, each of the first opening portion and the second opening portion may overlap the contact hole in a plan view.

According to some embodiments, a shape of the first opening portion in a plan view may correspond to a shape of the second opening portion in a plan view.

According to some embodiments, the first detection electrode may include a mesh pattern in which a mesh opening portion overlapping the emission area is defined.

According to some embodiments, the mesh pattern may include a first line part extending in a first direction, and a second line part extending in a second direction crossing the first direction, and the contact hole may be located at a point at which the first line part and the second line part cross each other.

According to some embodiments, a resistance value of the (1-1)-th conductive layer may be less than a resistance value of the (1-2)-th conductive layer, and a resistance value of the (2-1)-th conductive layer may be less than a resistance value of the (2-2)-th conductive layer.

According to some embodiments, each of the (1-1)-th conductive layer and the (2-1)-th conductive layer may include aluminum, and each of the (1-2)-th conductive layer and the (2-2)-th conductive layer CL2-3 may include titanium.

According to some embodiments, the input sensor further may include a second detection electrode insulated from and crossing the first detection electrode, and the second detection electrode may be provided in the form of one body and on the same layer.

According to some embodiments, a resistance value of the (1-1)-th conductive layer may be less than a resistance value of the (1-2)-th conductive layer, and a resistance value of the (2-1)-th conductive layer may be less than a resistance value of the (2-2)-th conductive layer.

According to some embodiments, the bridge pattern may overlap the second detection electrode, and be on a different layer from the second detection electrode.

According to some embodiments, the second detection electrode may be on the same layer as the first detection electrode.

According to some embodiments, a shape of each of the first opening portion and the second opening portion may correspond to a shape of the contact hole in a plan view.

According to some embodiments, the display panel may include a base layer including a display area and a non-display area, a transistor on the base layer and overlapping the display area. a light emitting element overlapping the display area and electrically connected to the transistor, and an encapsulation layer on the light emitting element, and an adhesive layer may not be between the encapsulation layer and the input sensor.

According to some embodiments, the bridge pattern may further include a (1-3)-th conductive layer directly on the other surface of the (1-1)-th conductive layer, and the first detection pattern may further include a (2-3)-th conductive layer directly on the other surface of the (2-1)-th conductive layer.

According to some embodiments of the present disclosure, a display device includes a display panel and an input sensor directly on the display panel. According to some embodiments, the input sensor may include a sensor base layer, a first sensor conductive layer on the sensor base layer, a sensor insulation layer on the sensor base layer covering the first sensor conductive layer, and a second sensor conductive layer on the sensor insulation layer, and electrically connected to the first sensor conductive layer through a contact hole passing through the sensor insulation layer. According to some embodiments, the first sensor conductive layer may include a (1-1)-th conductive layer, a (1-2)-th conductive layer directly on one surface of the (1-1)-th conductive layer, and a (1-3)-th conductive layer directly on the other surface of the (1-1)-th conductive layer, and the second sensor conductive layer may include a (2-1)-th conductive layer, a (2-2)-th conductive layer directly on one surface of the (2-1)-th conductive layer, and a (2-3)-th conductive layer directly on the other surface of the (2-1)-th conductive layer. According to some embodiments, a first opening portion that exposes the one surface of the (1-1)-th conductive layer may be defined in the (1-2)-th conductive layer, and a second opening portion that exposes the one surface of the (2-1)-th conductive layer may be defined in the (2-2)-th conductive layer. According to some embodiments, the one surface of the (1-1)-th conductive layer and the one surface of the (2-1)-th conductive layer, each of which overlaps the first and second opening portions, may be in contact with each other.

According to some embodiments, each of the first opening portion and the second opening portion may overlap the contact hole in a plan view.

According to some embodiments, a resistance value of the (1-1)-th conductive layer may be less than a resistance value of the (1-2)-th conductive layer, and a resistance value of the (2-1)-th conductive layer may be less than a resistance value of the (2-2)-th conductive layer.

According to some embodiments of the present disclosure, a method for manufacturing a display device includes forming a first sensor conductive layer, which is on a sensor base layer, and includes a (1-1)-th conductive layer and a (1-2)-th conductive layer directly on one surface of the (1-1)-th conductive layer, forming a sensor insulation layer which covers the first sensor conductive layer, forming a contact hole in the sensor insulation layer by using a mask, forming a (2-2)-th conductive layer on the sensor insulation layer, forming a first opening portion, which overlaps the contact hole, in the (1-2)-th conductive layer, and a second opening portion, which overlaps the contact hole, in the (2-2)-th conductive layer, and forming a (2-1)-th conductive layer on the (2-2)-th conductive layer to form a second sensor conductive layer comprising the (2-1)-th conductive layer and the (2-2)-th conductive layer. According to some embodiments, the one surface of the (1-1)-th conductive layer which overlaps the first opening portion and one surface of the (2-1)-th conductive layer which overlaps the second opening portion, may be in contact with each other.

According to some embodiments, in the forming of the first opening portion and the second opening portion, the same mask as the mask used in the forming of the contact hole may be used to etch the (1-2)-th conductive layer and the (2-2)-th conductive layer.

According to some embodiments, a shape of each of the first opening portion and the second opening portion may correspond to a shape of the contact hole in a plan view.

BRIEF DESCRIPTION OF THE FIGURES

The accompanying drawings are included to provide a further understanding of aspects of some embodiments of the present disclosure, and are incorporated in and constitute a part of this specification. The drawings illustrate embodiments of the inventive concept and, together with the description, serve to explain aspects of some embodiments of the present disclosure. In the drawings.

DETAILED DESCRIPTION

Figure 1:
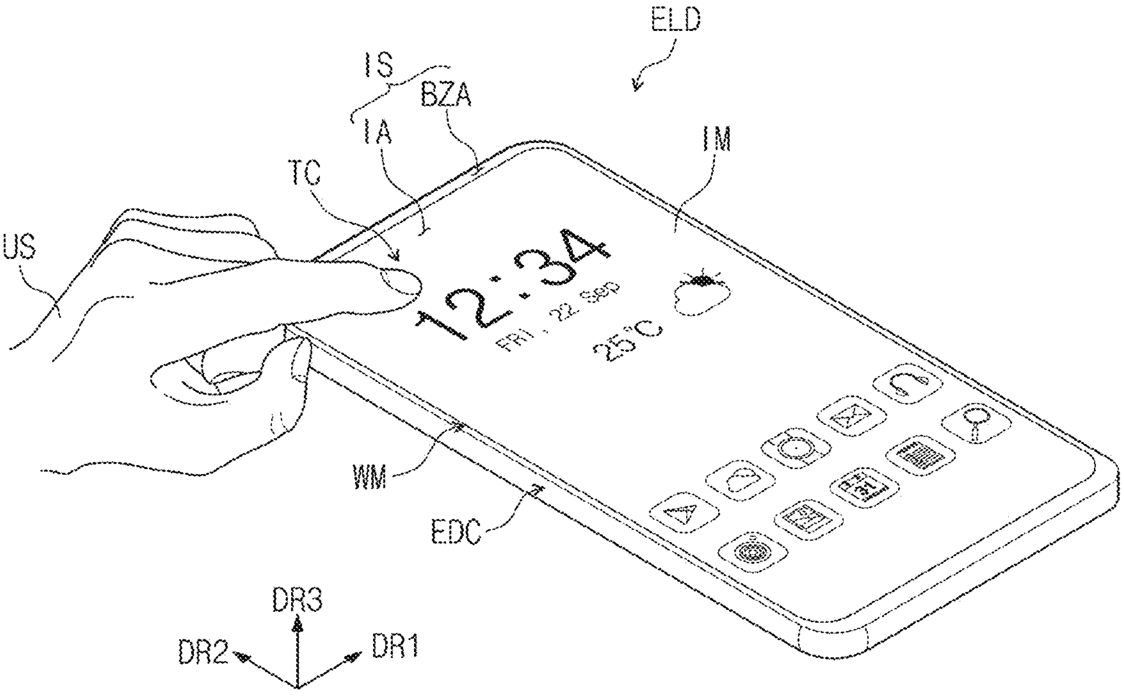
FIG. 1 is an assembled perspective view of an electronic device according to some embodiments of the present disclosure.

It will be understood that in this specification, when an element (or region, layer, section, etc.) is referred to as being "on", "connected to" or "coupled to" another element, it can be located directly on, connected or coupled to the other element or a third element may be located between the elements.

Like reference numbers or symbols refer to like elements throughout. In addition, in the drawings, the thickness, the ratio, and the dimension of elements are exaggerated for effective description of the technical contents. The term "and/or" includes one or more combinations which may be defined by relevant elements.

It will be understood that, although the terms first, second, etc. may be used herein to describe various elements, these elements should not be limited by these terms. These terms are only used to distinguish one element from another element. For example, a first element could be termed a second element without departing from the teachings of the present invention, and similarly, a second element could be termed a first element. As used herein, the singular forms are intended to include the plural forms as well, unless the context clearly indicates otherwise.

In addition, the terms, such as "below", "beneath", "on" and "above", are used for explaining the relation of elements shown in the drawings. The terms are relative concept and are explained based on the direction shown in the drawing.

It will be further understood that the terms such as "includes" or "has", when used herein, specify the presence of stated features, numerals, steps, operations, elements, parts, or the combination thereof, but do not preclude the presence or addition of one or more other features, numerals, steps, operations, elements, parts, or the combination thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, aspects of some embodiments of the present disclosure will be described in more detail with reference to the accompanying drawings.

Figure 2:
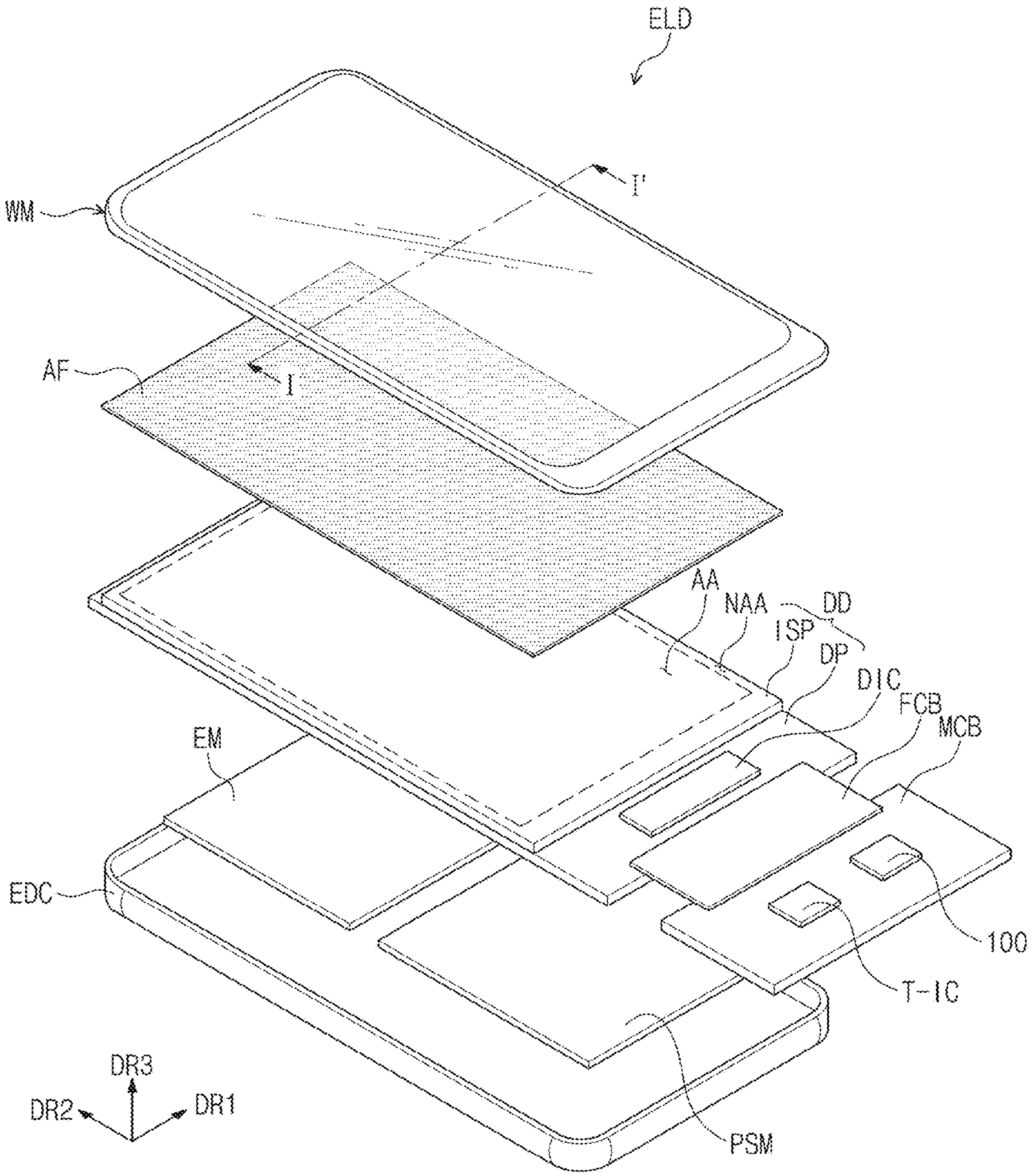
FIG. 2 is an exploded perspective view of an electronic device according to some embodiments of the present disclosure.

FIG. 1 is an assembled perspective view of an electronic device ELD according to some embodiments of the present disclosure. FIG. 2 is an exploded perspective view of the electronic device ELD according to some embodiments of the present disclosure.

Referring to FIG. 1, the electronic device ELD may be a device that is activated in response to an electrical signal and displays images. For examples, the electronic device ELD may be a large-sized device such as a television or an outdoor billboard, and may also be a small and medium-sized device such as a monitor, a mobile phone, a tablet computer, a navigation device, a game console. However, embodiments of the electronic device ELD are examples, and are not limited to any one unless departing from the inventive concept of the present disclosure.

The electronic device ELD may be rigid or flexible. The term "flexible" means a characteristic of being capable of bending. For example, the flexible electronic device ELD may include a curved device, a rollable device, or a foldable device.

In the following disclosure, a third direction DR3 may be defined as a direction perpendicular to a plane defined by a first direction DR1 and a second direction DR2. A front surface (or top surface) and a rear surface (or bottom surface) of each of members, which constitute the electronic device ELD, may oppose each other in the third direction DR3, and a normal direction to each of the front surface and the rear surface may be substantially parallel to the third direction DR3. A spaced distance between the front surface and the rear surface, which is defined in the third direction DR3, may correspond to a thickness of the member.

The phrase "on a plane" used herein may be defined as being in a state when viewed in the third direction DR3 or in a plan view. Meanwhile, directions indicated by the first, second, and third directions DR1, DR2 and DR3 are relative concepts and may be changed to other directions.

The electronic device ELD may display an image IM in or toward a third direction DR3 through a display surface IS parallel to a plane defined by the first direction DR1 and the second direction DR2. However, embodiments according to the present disclosure are not limited thereto, and the display surface IS may further include a curved surface that is bent from at least one side of the plane. The display surface IS on which the image IM is displayed may correspond to a front surface of the electronic device ELD. The image IM may include not only a dynamic image (e.g., video or moving images) but also a still or static image. FIG. 1 illustrates icon images and a clock as an example of the image IM.

The electronic device ELD may have a rectangular shape having short sides extending in the first direction DR1 and having long sides extending in the second direction DR2 crossing the first direction DR1 on a plane (or in a plan view). However, embodiments according to the present disclosure are not limited thereto, and the electronic device ELD may have various shapes such as a circular shape, elliptical shape, a polygonal shape, and the like, on a plane (or in a plan view).

The electronic device ELD may detect an external input TC applied from the outside. The external input TC may include various types of inputs such as touch, power, pressure, temperature, and light. In the present disclosure, a touch input by a user US's hand applied to the front surface of the electronic device ELD is illustrated an example of the external input TC. However, this is an example, and the external input TC may include all of various types of inputs that may cause a variation in capacitance of an input sensor or otherwise provide an input signal to the electronic device ELD. An area of the electronic device ELD, which detects the external input TC, is not limited to the front surface of the electronic device ELD, and the electronic device ELD may detect the user US's external input TC applied to a side surface or a rear surface thereof according to a structure of the electronic device ELD.

The display surface IS of the electronic device ELD may include an image area IA and a bezel area BZA. The image area IA may be an area on which the image IM is displayed. The user may see the image IM through the image area IA. According to some embodiments, the image area IA has a rectangular shape with vertices that are rounded. However, this is illustrated as an example, and the image area IA may have various shapes.

The bezel area BZA may be an area that has a color (e.g., a set or predetermined color) and shields light. The bezel area BZA may be adjacent to the image area IA. For example, the bezel area BZA may be located outside the image area IA to surround the image area IA. Accordingly, a shape of the image area IA may be defined substantially by the bezel area BZA. However, this is illustrated as an example. The bezel area BZA may be adjacent only to one side of the image area IA, may be located on the side surface of the electronic device ELD, or may be omitted.

Referring to FIGS. 1 and 2, the electronic device ELD may include a window WM, a display device DD, an optical member AF, an electronic module EM, a power module PSM, and a case EDC.

The window WM may be located on the display device DD and the optical member AF. The window WM may protect the display device DD from scratches or external impacts applied to the display device DD. A front surface of the window WM may correspond to the display surface IS of the electronic device ELD described above.

The optical member AF may be located on the display device DD. The optical member AF may include various embodiments that relatively reduce reflectance of external light. For example, the optical member AF may include a polarizing film including a retarder and/or a polarizer, a plurality of reflective layers that cause reflected light to destructively interfere with each other, or color filters arranged to correspond to arrangement and emission colors of pixels in a display panel DP.

The display device DD may generate the image IM output to the outside of the electronic device ELD, and detect the external input TC. The display device DD may include the display panel DP and an input sensor ISP.

The display panel DP may display the image IM in response to an electrical signal. The display panel DP according to some embodiments may be a light emitting display panel, but embodiments according to the present disclosure are not particularly limited thereto. For example, the display panel DP may be an organic light emitting display panel, an inorganic light emitting display panel, or a quantum dot light emitting display panel. Hereinafter, the display panel DP is described as an organic light emitting display panel.

The input sensor ISP may be located on the display panel DP. The input sensor ISP may detect the external input TC to provide an input signal including information of the external input TC so that the display panel DP generates the image IM corresponding to the external input TC. The input sensor ISP may be driven by various methods such as a capacitance method, a resistive method, an infrared method, a sonic method, or a pressure method, and is not limited to any one. Although the input sensor ISP is described as being driven by a capacitance method, embodiments according to the present disclosure are not limited thereto.

The display device DD may include an active area AA, and a peripheral area NAA adjacent to (e.g., in a periphery or outside a footprint of) the active area AA. The active area AA may be an area on which a light emitting element of the display panel DP or a detection electrode of the input sensor ISP is located, and may be activated in response to an electrical signal to display the image IM or detect the external input TC. The peripheral area NAA may be an area on which a driving circuit for driving elements located on the active area AA, a signal line, a pad, and the like are located.

The active area AA may overlap the image area IA of the electronic device ELD, and the peripheral area NAA may overlap the bezel area BZA of the electronic device ELD. The bezel area BZA may prevent components located on the peripheral area NAA from being visible from the outside.

The display device DD may further include a main circuit board MCB, a flexible circuit board FCB, a data driver DIC, a sensor control circuit T-IC, and a main controller 100.

The main circuit board MCB may include driving elements. The main circuit board MCB may be electrically connected to each of the display panel DP and the input sensor ISP through the flexible circuit film FCB. The main circuit board MCB may be electrically connected to the electronic module EM through a connector.

The flexible circuit film FCB may be connected to the display panel DP to electrically connect the display panel DP to the main circuit board MCB. The input sensor ISP may be electrically connected to the display panel DP so that the input sensor ISP is electrically connected to the main circuit board MCB through the flexible circuit film FCB. However, embodiments according to the present disclosure are not limited thereto. For example, the input sensor ISP may be electrically connected to the main circuit board MCB through an additional flexible circuit film, or alternatively the flexible circuit film FCB may be omitted and the main circuit board MCB may be connected directly on the display panel DP.

Each of the data driver DIC, the sensor control circuit T-IC, and the main controller 100 may be provided in the form of an integrated chip. The data driver DIC may be mounted on the display panel DP, and the sensor control circuit T-IC and the main controller 100 may be mounted on the main circuit board MCB. However, embodiments according to the present disclosure are not limited thereto. For example, the data driver DIC may be mounted on the flexible circuit film FCB.

The main controller 100 may control an overall operation of the electronic device ELD. For example, the main controller 100 may control an operation of each of the display panel DP and the input sensor ISP. In addition, the main controller 100 may control an operation of the electronic module EM. The main controller 100 may include at least one microprocessor.

The data driver DIC may include a driving circuit for driving pixels of the display panel DP. The data driver DIC may receive image data and a control signal from the main controller 100. For example, the control signal may include an input vertical synchronization signal, an input horizontal synchronization signal, a main clock, a data enable signal, and the like.

The sensor control circuit T-IC may provide the input sensor ISP with an electrical signal for driving the input sensor ISP. The sensor control circuit T-IC may receive a control signal such as a clock signal, from the main controller 100.

The electronic module EM may include various functional modules required for driving the display device DD. For example, the electronic module EM may include a wireless communication module, an image input module, a sound input module, a sound output module, a memory, an external interface module, and the like. The modules of the electronic module EM may be mounted on the main circuit board MCB, and be electrically connected to the main circuit board MCB through a separate flexible circuit board.

The power module PSM may be electrically connected to the electronic module EM. The power module PSM may supply power required for the overall operation of the electronic device ELD. For example, the power module PSM may include a typical battery device.

The window WM and the case EDC may be coupled to each other to provide an outer appearance of the electronic device ELD. The window WM and the case EDC may be coupled to each other to define an inner space in which components of the electronic device ELD are accommodated. The display device DD, the flexible circuit film FCB, the main circuit board MCB, the electronic module EM, the power module PSM, and the like may be accommodated in the inner space. The display panel DP may be accommodated in the case EDC by being bent so that each of the flexible circuit film FCB and the main circuit board MCB faces the rear surface of the display device DD.

The case EDC may include a material having relatively high rigidity. For examples, the case EDC may include glass, plastic, or metal, or include a plurality of frames and/or plates made of a combination thereof. The case EDC may absorb an impact applied from the outside or prevent a foreign matter/moisture or the like from being introduced from the outside, thereby protecting the display device DD accommodated in the case EDC.

Figure 3A:
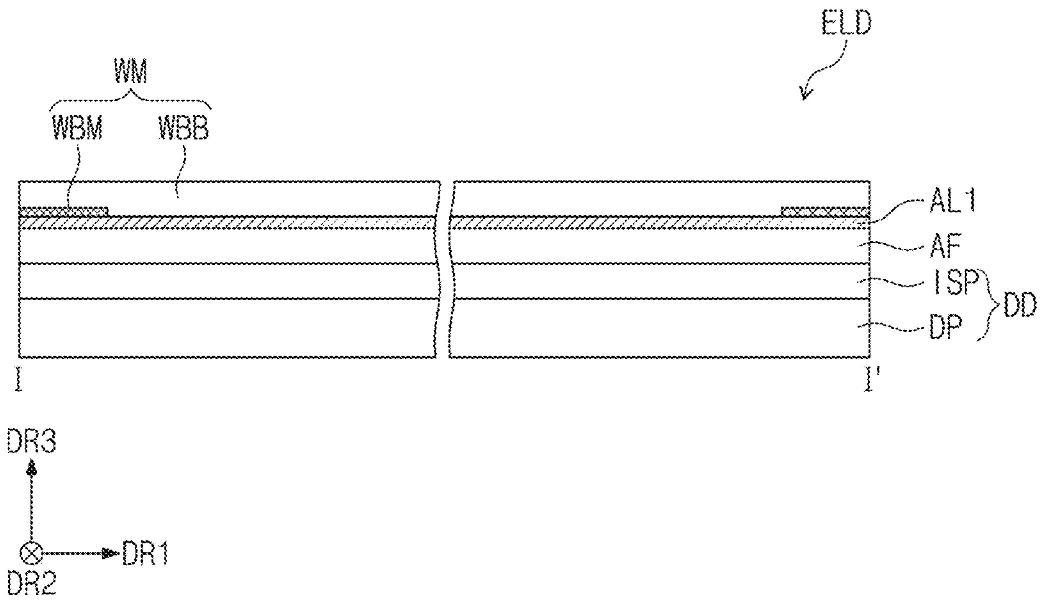
FIGS. 3A and 3B are each a cross-sectional view of the electronic device taken along the line I-I' in FIG. 2.
Figure 3B:
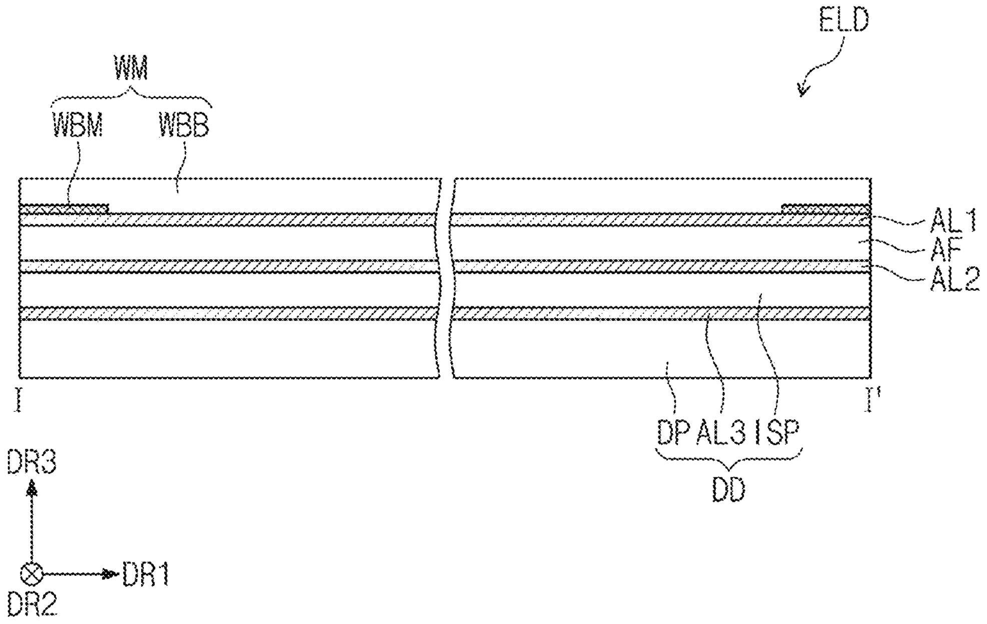

FIGS. 3A and 3B are each a cross-sectional view of the electronic device ELD taken along the line I-I' in FIG. 2. FIGS. 3A and 3B illustrate various embodiments according to stacked shapes of components included in electronic device ELD, and the foregoing descriptions may apply to a window WM, a display panel DP, and an input sensor ISP.

Referring to FIGS. 3A and 3B, the window WM may include a base film WBB and a bezel pattern WBM. The base film WBB may include an optically transparent insulation material. The base film WBB may include at least one of a glass film or a synthetic resin film. The base film WBB may have a single-layer structure, or have a multilayer structure in which a plurality of films are coupled to each other. The window WM may further include a functional layer, such as an anti-fingerprint layer, a phase control layer, or a hard coating layer, which is located on the base film WBB.

The bezel pattern WBM may be a color layer provided on one surface of the base film WBB. The bezel pattern WBM may include a material having a color. For example, the bezel pattern WBM may include a colored organic film. The bezel pattern WBM may have a single-layer structure or a multilayer structure. The bezel pattern WBM having a multilayer structure may include a color layer having a chromatic color, and a light shielding layer having an achromatic color (particularly, black color). The bezel pattern WBM may be formed through deposition, printing, and coating.

The bezel pattern WBM may be arranged to correspond to the bezel area BZA (see FIG. 1) of the electronic device ELD. A partial area of the window WM, in which the bezel pattern WBM is located, may have a lower light transmittance than an area in which the bezel pattern WBM is not located.

A first adhesive layer AP1 may be located between the window WM and the optical member AF. The window WM and the optical member AF may be coupled to each other through the first adhesive layer AP1. However, embodiments according to the present disclosure are not limited thereto. For example, the first adhesive layer AP1 may be omitted, or the window WM may be located directly on the optical member AF.

Referring to FIG. 3A, the input sensor ISP may be located directly on the display panel DP. In a process of manufacturing the display device DD, the input sensor ISP may be formed on a base surface provided by the display panel DP through a continuous process. The input sensor ISP and the display panel DP may be coupled into one body without a separate adhesive layer.

Referring to FIG. 3A, the optical member AF may be located directly on the display device DD. For example, the optical member AF may be formed on a top surface of the input sensor ISP through a continuous process. The optical member AF may include a color filter, and the optical member AF may be provided by applying and patterning or printing a composition of the color filter onto a base surface provided by the input sensor ISP.

However, embodiments according to the present disclosure are not limited thereto, and referring to FIG. 3B, the optical member AF may be coupled onto the display device DD through a second adhesive layer AL2. For example, the optical member AF may be provided in the form of a film such as a polarizing film, and may be coupled to the display device DD through the second adhesive layer AL2 located on a top surface of the input sensor ISP.

Referring to FIG. 3B, the display device DD may further include a third adhesive layer AL3 located between the input sensor ISP and the display panel DP. The input sensor ISP may be coupled to the display panel DP through the third adhesive layer AL3. For example, the input sensor ISP may be provided as a touch panel manufactured through a separate process divided from a process of manufacturing the display panel DP, and the input sensor ISP may be coupled to the display panel DP through the third adhesive layer AL3 located on a top surface of the display panel DP.

Each of the first to third adhesive layers AL1, AL2 and AL3 described above may include a transparent adhesive such as an optically clear adhesive (OCA), an optically clear resin (OCR), or a pressure sensitive adhesive (PSA). However, embodiments according to the present disclosure are not limited thereto.

The stacked components and the stacking order in the electronic device ELD illustrated in FIGS. 3A and 3B are examples and are not limited thereto. For example, the electronic device ELD may further include a protective layer located below the display panel DP, or the optical member AF may be omitted. In addition, the stacking order of the optical member AF and the input sensor ISP may be changed, and the optical member AF may be located between the display panel DP and the input sensor ISP.

Figure 4A:
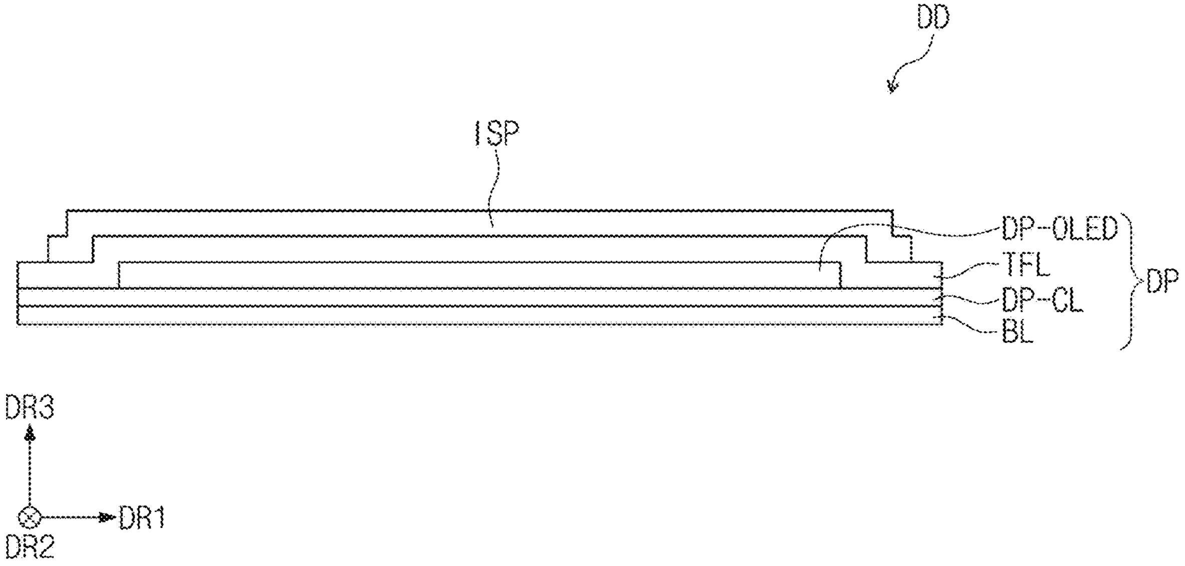
FIGS. 4A to 4C are each a cross-sectional view of a display device according to some embodiments of the present disclosure.
Figure 4B:
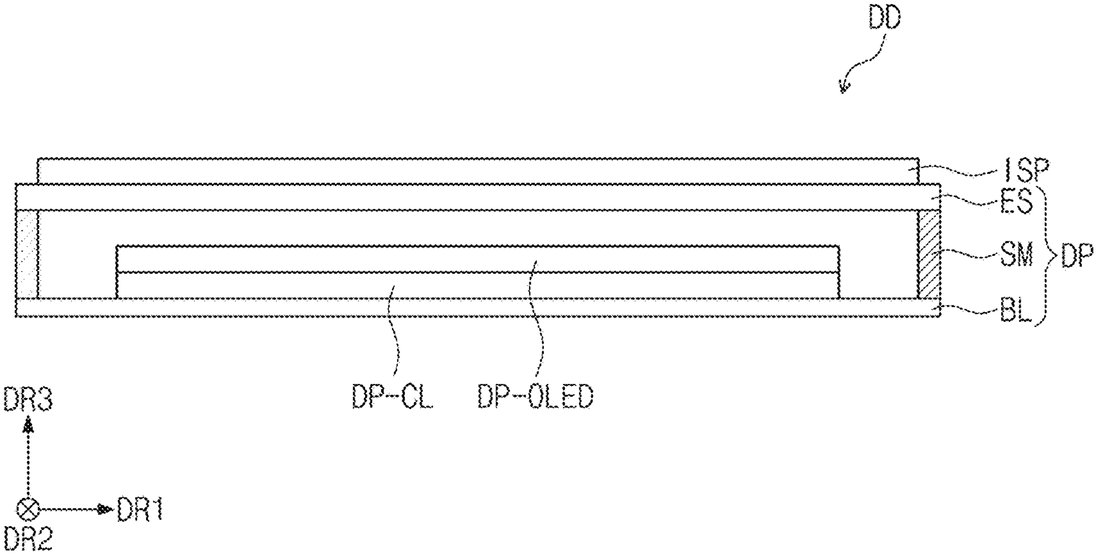
Figure 4C:
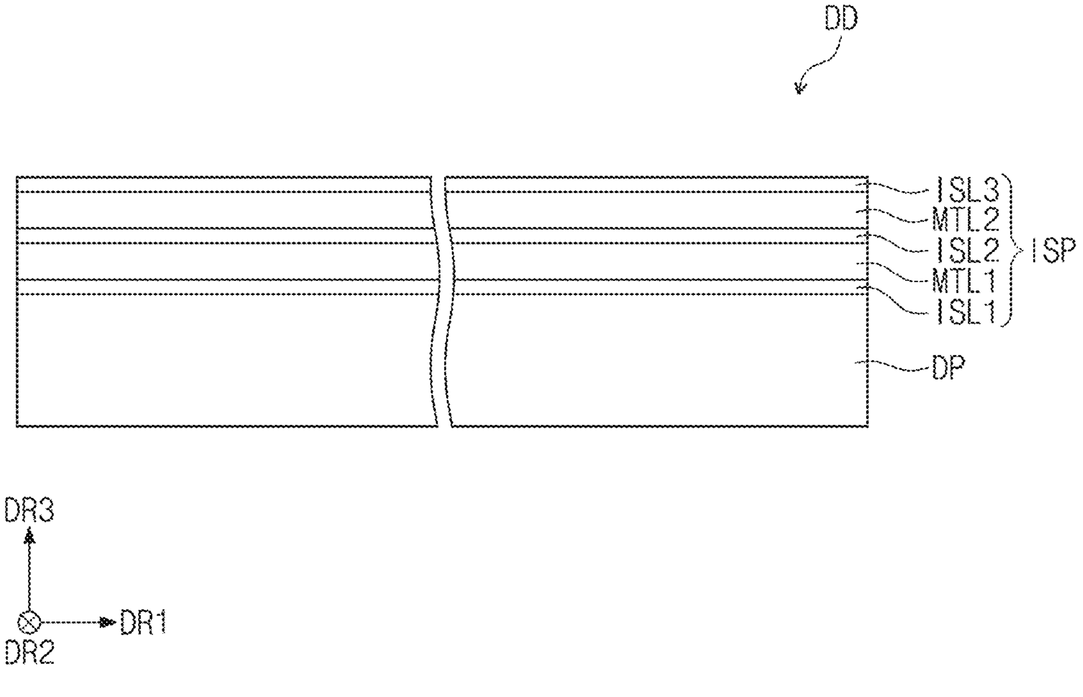

FIGS. 4A to 4C are each a cross-sectional view of a display device DD according to some embodiments of the present disclosure. The foregoing descriptions may apply to a display panel DP and an input sensor ISP illustrated in FIGS. 4A to 4C.

Referring to FIG. 4A, the display panel DP may include a base layer BL, a circuit element layer DP-CL, a display element layer DP-OLED, and an encapsulation layer TFL.

The base layer BS may provide a base surface on which the circuit element layer DP-CL is located. The base substrate BS may be a rigid substrate, or a flexible substrate capable of being bent, folded, rolled, or the like. The base layer BS may include a plastic substrate, a glass substrate, a metal substrate, an organic/inorganic composite material substrate, or the like. The base layer BS may have a multilayer structure. For example, the base layer BS may include an inorganic layer, a synthetic resin layer, or a composite material layer.

The circuit element layer DP-CL may be located on the base layer BL. The circuit element layer DP-CL may include at least one insulation layer, a semiconductor pattern, and a conductive pattern. The insulation layer, the semiconductor pattern, and the conductive pattern of the circuit element layer DP-CL may be provided by forming the insulation layer, a semiconductor layer, and a conductive layer through coating, deposition, or the like, and then patterning the insulation layer, the semiconductor layer, and the conductive layer by performing a photolithography process multiple times. The insulation layer, the semiconductor pattern, and the conductive pattern included in the circuit element layer DP-CL may provide driving elements such as transistor, signal lines, and pads in the circuit element layer DP-CL.

The display element layer DP-OLED may be located on the circuit element layer DP-CL. The display element layer DP-OLED may include light emitting elements. The light emitting elements of the display element layer DP-OLED may be electrically connected to the driving elements of the circuit element layer DP-CL. Accordingly, the light emitting elements may generate light in response to signals provided by the driving elements to display an image.

The encapsulation layer TFL may be located on the display element layer DP-OLED to seal the light emitting elements. The encapsulation layer TFL may include at least one thin film for relatively improving optical efficiency of the display element layer DP-OLED, or protecting the display element layer DP-OLED.

Referring to FIG. 4B, the display panel DP according to some embodiments may include a base layer BL, a circuit element layer DP-CL, a display element layer DP-OLED, an encapsulation substrate ES, and a sealant SM.

The circuit element layer DP-CL may be located on the base layer BL, and the display element layer DP-OLED may be located on the circuit element layer DP-CL.

The sealant SM may be located between the base layer BL and the encapsulation substrate ES. The sealant SM may couple the base layer BL and the encapsulation substrate ES to each other. The sealant SM may include an organic adhesive layer, a frit, or the like.

The encapsulation substrate ES may be located on the display element layer DP-OLED. Each of the base layer BL and the encapsulation substrate ES may include a plastic substrate, a glass substrate, a metal substrate, an organic/inorganic composite material substrate, or the like. The encapsulation substrate ES may be spaced a gap (e.g., a set or predetermined gap) from the display element layer DP-OLED in the third direction DR3. According to some embodiments, the display panel DP may further include a filling layer filled in the gap. The filling layer may include a moisture absorbent or a resin material.

Referring to FIG. 4C, the input sensor ISP may include a sensor base layer ISL1, a first sensor conductive layer MTL1, a first sensor insulation layer ISL2, a second sensor conductive layer MTL2, and a second sensor insulation layer ISL3. The sensor base layer ISL1 may be located directly on the display panel DP. However, embodiments according to the present disclosure are not limited thereto, and the sensor base layer ISL1 may be omitted. In this case, the first sensor conductive layer MTL1 may be located directly on the display panel DP.

Each of the first sensor conductive layer MTL1 and the second sensor conductive layer MTL2 may have a single-layer structure or a multilayer structure. The conductive layer having a multilayer structure may have a structure in which a transparent conductive layer and/or a metal layer are stacked in two or more layers. For example, the conductive layer having a multilayer structure may have a structure in which a transparent conductive layer and a metal layer are stacked, or a structure in which metal layers including different metals are stacked.

The transparent conductive layer included in each of the first sensor conductive layer MTL1 and the second sensor conductive layer MTL2 may include an indium tin oxide (ITO), an indium zinc oxide (IZO), a zinc oxide (ZnO), an indium zinc tin oxide (IZTO), PEDOT, a metal nanowire, graphene, or the like. The metal layer included in each of the first sensor conductive layer MTL1 and the second sensor conductive layer MTL2 may include molybdenum, silver, titanium, copper, aluminum, or an alloy thereof. A detailed structure of each of the first sensor conductive layer MTL1 and the second sensor conductive layer MTL2 will be described later.

In the first sensor conductive layer MTL1 and the second sensor conductive layer MTL2 each having a multilayer structure, a metal having relatively high durability and low reflectance may apply to an outer side of the sensor conductive layer, and a metal having high electric conductivity may apply to an inner layer of the sensor conductive layer. For example, each of the first sensor conductive layer MTL1 and the second sensor conductive layer MTL2 may have a three-layer structure including titanium/aluminum/titanium, or a three-layer structure including titanium/copper/titanium. In the first sensor conductive layer MTL1 and the second sensor conductive layer MTL2, the structure including titanium/copper/titanium may have low resistance characteristics compared to the structure including titanium/aluminum/titanium.

Each of the first sensor conductive layer MTL1 and the second sensor conductive layer MTL2 may include detection electrodes TE (see FIG. 7) of the input sensor ISP that will be described later, and may further include trace lines TL (see FIG. 7).

The first sensor insulation layer ISL2 may be located on the first sensor conductive layer MTL1. The second sensor insulation layer ISL3 may be located on the second sensor conductive layer MTL2. Each of the first sensor insulation layer ISL2 and the second sensor insulation layer ISL3 may include an inorganic film or an organic film.

For example, the inorganic film may include at least one of an aluminum oxide, a titanium oxide, a silicon oxide, a silicon oxynitride, a zirconium oxide, or a hafnium oxide. The organic film may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, a perylene-based resin, or a polyimide-based resin.

Figure 5:
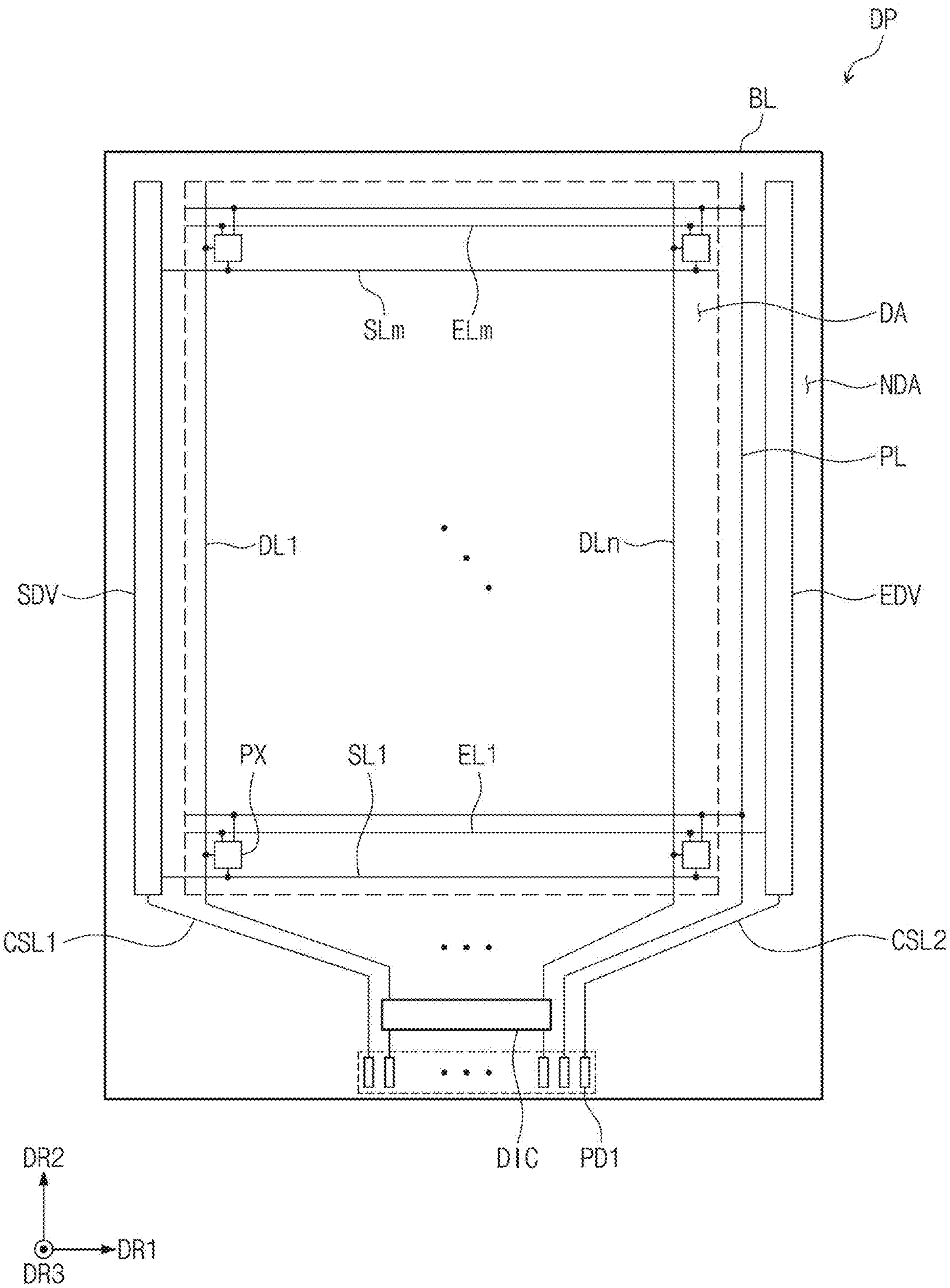
FIG. 5 is a plan view of a display panel according to some embodiments of the present disclosure.

FIG. 5 is a plan view of a display panel DP to some embodiments of the present disclosure.

Referring to FIG. 5, the display panel DP may include a base layer BL, pixels PX, signal lines SL1 to SLm, DL1 to DLn, EL1 to ELm, CSL1, CSL2 and PL electrically connected to the pixels PX, a scan driver SDV, a data driver DIC, an emission driver EDV, and pads PD1.

The base layer BS may provide a base surface on which elements and lines of the display panel DP are located. The base layer BS may include a display area DA and a non-display area NDA. The display area DA may be an area on which the pixels PX are displayed, and images are displayed. The non-display area NDA may be an area which is adjacent to (e.g., in a periphery or outside a footprint of) the display area DA, and on which lines and elements for driving the pixels PX are located, and an images are not displayed. The display area DA may correspond to the active area AA (see FIG. 2) of the display device DD, and the non-display area NDA may correspond to the peripheral area NAA (see FIG. 2) of the display device DD.

Each of the pixels PX may include a pixel driving circuit including transistors (e.g., a switching transistor, a driving transistor, etc.) and a capacitor, and a light emitting element electrically connected to the pixel driving circuit. Each of the pixels PX may emit light in response to electrical signals applied to the pixel PX.

Each of the scan driver SDV, the data driver DIC, and the emission driver EDV may be located in the non-display area NDA. However, embodiments according to the present disclosure are not limited thereto. For example, at least one of the scan driver SDV, the data driver DIC, or the emission driver EDV may be located in the display area DA, and accordingly, a surface area of the non-display area NDA may be relatively decreased.

The signal lines SL1 to SLm, EL1 to ELm, DL1 to DLn, CSL1, CSL2 and PL may include scan lines SL1 to SLm, data lines DL1 to DLn, emission lines EL1 to ELm, first and second lines CSL1 and CSL2, and a power line PL. Here, m and n are each a natural number of 1 or greater. Each of the pixels PX may be electrically connected to a scan line, a data line, and an emission line, which correspond to the pixel, of the scan lines SL1 to Slm, the data lines DL1 to DLn, and the emission lines EL1 to Elm, respectively. According to the configuration of the pixel driving circuit of the pixels PX, more types of signal lines may be provided in the display panel DP.

The scan lines SL1 to SLm may extend in the first direction DR1 to be electrically connected to the scan driver SDV. The data lines DL1 to DLn may extend in the second direction DR2 to be electrically connected to the data driver DIC. The emission lines EL1 to ELm may extend in the first direction DR1 to be electrically connected to the emission driver EDV.

The power line PL may include a portion extending in the first direction DR1 and a portion extending in the second direction DR2. The portion extending in the first direction DR1 and the portion extending in the second direction DR2 may be located on different layers and connected to each other through a contact hole. However, embodiments according to the present disclosure are not limited thereto. For example, in the power line PL, the portion extending in the first direction DR1 and the portion extending in the second direction DR2 may be provided in the form of one body on the same layer.

The portion, which extends in the first direction DR1, of the power line PL may extend to the display area DA to be electrically connected to the pixels PX, and the portion, which extends in the second direction DR2, of the power line PL may be located in the non-display area DNA to extend toward the pad PD1. The power line PL may receive a power voltage to supply the power voltage to the pixels PX.

A first control line CSL1 may be electrically connected to the scan driver SDV. A second control line CSL2 may be electrically connected to the emission driver EDV.

The pads PD1 may be arranged to be adjacent to a lower end of the non-display area NDA. The pads PD1 may be arranged to be more adjacent to a lower end of the display panel DP than the data driver DIC. The pads PD1 may be arranged to be spaced apart from each other in the first direction DR1. Each of the pads PD1 may be a portion to which a circuit board that provides a signal for controlling an operation of each of the scan driver SDV, the data driver DIC, and the emission driver EDV of the display panel DP is electrically connected.

Each of the pads PD1 may be connected to a corresponding signal line of the signal lines SL1 to SLm, EL1 to ELm, DL1 to DLn, CSL1, CSL2 and PL. For example, the power line PL, the first and second lines CSL1 and CSL2, and the data lines DL1 to DLn may be connected to corresponding pads PD1, respectively. Each of the data lines DL1 to DLn may be connected to the corresponding pad PD1 through the data driver DIC.

The scan driver SDV may generate scan signals in response to a scan control signal. The scan signals may be applied to the pixels PX through the scan lines SL1 to SLm. The data driver DIC may generate data voltages corresponding to image signals in response to a data control signal. The data voltages may be applied to the pixels PX through the data lines DL1 to DLn. The emission driver EDV may generate emission signals in response to an emission control signal. The emission signals may be applied to the pixels PX through the emission lines EL1 to ELm. The pixels PX may be provided with the data voltages in response to the scan signals. The pixels PX may display an image by emitting light with brightness corresponding to the data voltages in response to the emission signals. An emission time of the pixels PX may be controlled by the emission signals. Thus, the display panel DP may generate an image on the display area DA through the pixels PX.

Figure 6:
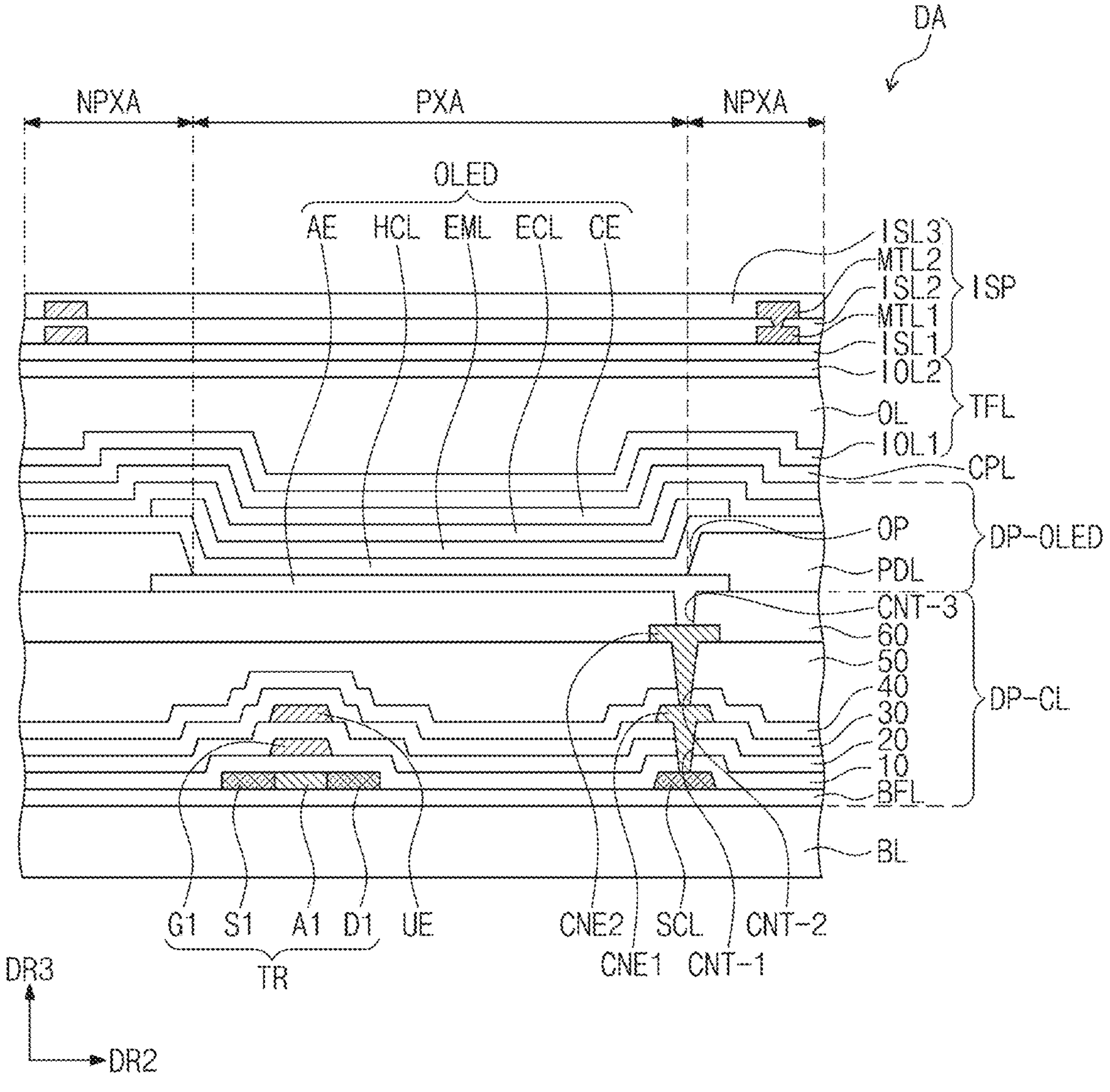
FIG. 6 is a cross-sectional view of a display panel and an input sensor according to some embodiments of the present disclosure.

FIG. 6 is a cross-sectional view of a display panel DP and an input sensor ISP according to some embodiments of the present disclosure. FIG. 6 illustrates a partial cross-section of the display panel DP.

Referring to FIG. 6, a circuit element layer DP-CL, a display element layer DP-OLED, an encapsulation layer TFL, and the input sensor ISP may be arranged in sequence on a base layer BL.

The circuit element layer DP-CL may include at least one insulation layer and a circuit element. The circuit element may include a signal line, a driving circuit of a pixel, and the like. The circuit element layer DP-CL may be formed through a process of forming an insulation layer, a semiconductor layer, and a conductive layer by coating, deposition, or the like, and through a process of patterning the insulation layer, the semiconductor layer, and the conductive layer by photolithography.

A buffer layer BFL may include a plurality of stacked inorganic layers. A semiconductor pattern may be located on the buffer layer BFL. The buffer layer BFL relatively improves bonding force between the base layer BL and the semiconductor pattern.

A transistor TR may be located on the base layer BL, and overlap the display area DA (see FIG. 5). The transistor TR may include a first region A1 and second regions S1 and D1, which are the semiconductor pattern, and a gate G1. The semiconductor pattern may include polysilicon. However, embodiments according to the present disclosure are not limited thereto, and the semiconductor pattern may also include amorphous silicon or a metal oxide. FIG. 6 just illustrates a portion of the semiconductor pattern, and the semiconductor pattern may be further located in another area of the pixel PX on a plane (or in a plan view). The semiconductor pattern may be arranged over the pixels PX according to a specific rule.

The semiconductor pattern may have different electrical properties according to whether the semiconductor pattern is doped or not. The semiconductor pattern may include the first region A1 having low doping concentration and conductivity, and the second regions S1 and D1 each having relatively high doping concentration and conductivity. One second region S1 may be located at one side of the first region A1, and another second region D1 may be located at the other side of the first region A1. The second regions S1 and D1 may be doped with an n-type dopant or a p-type dopant. A p-type transistor includes a doped region doped with the p-type dopant. The first region A1 may be a non-doped region, or may be doped to have a lower concentration than each of the second regions S1 and D1.

Each of the second regions S1 and D1 may substantially serve as an electrode or a signal line. One second region S1 may correspond to a source of a transistor, and another second region D1 may be a drain of the transistor. FIG. 6 illustrates a portion of a connection signal line SCL provided from the semiconductor pattern. Although not separately illustrated, the connection signal line SCL may be connected to the drain of the transistor TR on a plane (or in a plan view).

A first insulation layer 10 is located on the buffer layer BFL. The first insulation layer 10 overlaps, in common, in the plurality of pixels PX (see FIG. 5), and covers the semiconductor pattern. The first insulation layer 10 may be an inorganic layer and/or an organic layer, and have a single-layer or multilayer structure. The first insulation layer 10 may include at least one of an aluminum oxide, a titanium oxide, a silicon oxide, a silicon oxynitride, a zirconium oxide, or a hafnium oxide. In addition to the first insulation layer 10, an insulation layer of the circuit element layer DP-CL that will be described later may be an inorganic layer and/or an organic layer, and have a single-layer or multilayer structure.

The gate G1 is located on the first insulation layer 10. The gate G1 may include a metal layer having a multilayer structure. The gate G1 overlaps the first region A1. The gate G1 may serve as a mask in the process of doping the semiconductor pattern.

A second insulation layer 20 that covers the gate G1 is located on the first insulation layer 10. The second insulation layer 20 overlaps, in common, in the pixels PX (see FIG. 5). An upper electrode UE may be located on the second insulation layer 20. The upper electrode UE may overlap the gate G1. The upper electrode UE may include a metal layer having a multilayer structure. According to some embodiments of the present disclosure, the upper electrode UE may be omitted.

A third insulation layer 30 that covers the upper electrode UE is located on the second insulation layer 20. A first connection electrode CNE1 may be located on the third insulation layer 30. The first connection electrode CNE1 may be connected to the connection signal line SCL through a contact hole CNT-1 passing through the first to third insulation layers 10 to 30.

A fourth insulation layer 40 is located on the third insulation layer 30. A fifth insulation layer 50 is located on the fourth insulation layer 40. The fifth insulation layer 50 may be an organic layer. A second connection electrode CNE2 may be located on the fifth insulation layer 50. The second connection electrode CNE2 may be connected to the first connection electrode CNE1 through a contact hole CNT-2 passing through the fourth insulation layer 40 and the fifth insulation layer 50.

A sixth insulation layer 60 that covers the second connection electrode CNE2 is located on the fifth insulation layer 50. The sixth insulation layer 60 may be an organic layer. A light emitting element OLED that is a display element is located on the sixth insulation layer 60. The light emitting element OLED may overlap the display area DA (see FIG. 5), and be electrically connected to the transistor TR.

A first electrode AE (or anode) is located on the sixth insulation layer 60. The first electrode AE may be connected to the second connection electrode CNE2 through a contact hole CNT-3 passing through the sixth insulation layer 60. An opening portion OP is defined in a pixel defining film PDL. The opening portion OP of the pixel defining film PDL exposes at least a portion of the first electrode AE. The pixel defining film PDL may be an organic layer.

As illustrated in FIG. 6, the display area DA may include an emission area PXA, and a non-emission area NPXA adjacent to the emission area PXA. The non-emission area NPXA may surround the emission area PXA. According to some embodiments, the emission area PXA is defined to correspond to a partial area of the first electrode AE, which is exposed by the opening portion OP.

A hole control layer HCL may be located, in common, in the emission area PXA and the non-emission area NPXA. The hole control layer HCL may include a hole transport layer, and further include a hole injection layer. An emission layer EML is located on the hole control layer HCL. The emission layer EML may be located at an area corresponding to the opening portion OP. That is, the emission layer EML may be divided and provided in each of the pixels PX (see FIG. 5).

An electron control layer ECL is located on the emission layer EML. The electron control layer ECL may include an electron transport layer, and further include an electron injection layer. The hole control layer HCL and the electron control layer ECL may be provided, in common, in the plurality of pixels by using an open mask. A second electrode CE (or cathode) is located on the electron control layer ECL. The second electrode CE is provided in the form of one body, and located, in common, in the plurality of pixels PX (see FIG. 5). As illustrated in FIG. 6, the encapsulation layer TFL is located on the second electrode CE.

A capping layer CPL may be located on the second electrode CE, and be in contact with the second electrode CE. The encapsulation layer TFL may be located on the capping layer CPL, and include a plurality of thin films.

The encapsulation layer TFL may include a first inorganic layer IOL1, an organic layer OL, and a second inorganic layer IOL2. The first inorganic layer IOL1 and the second inorganic layer IOL2 may protect the display element layer DP-OLED from moisture/oxygen, and the organic layer OL may protect the display element layer DP-OLED from foreign matters such as dust particles.

The input sensor ISP may be located on the display panel DP. The input sensor ISP may be located directly on the display panel DP. The input sensor ISP may be located directly on the encapsulation layer TFL. An adhesive layer may not be located between the input sensor ISP and the encapsulation layer TFL. The input sensor ISP may be formed directly on a top surface of the encapsulation layer TFL through a continuous process.

The input sensor ISP may include a sensor base layer ISL1, a first sensor insulation layer ISL2, a second sensor insulation layer ISL3, a first sensor conductive layer MTL1, and a second sensor conductive layer MTL2. The sensor base layer ISL1 may be located directly on the encapsulation layer TFL. The sensor base layer ISL1 may be omitted when necessary.

The first sensor conductive layer MTL1 may be located on the sensor base layer ISL1, and overlap the non-emission area NPXA. The first sensor insulation layer ISL2 may be located on the sensor base layer ISL1. The first sensor insulation layer ISL2 may cover the first sensor conductive layer MTL1. The second sensor conductive layer MTL2 may be located on the first sensor insulation layer ISL2, and overlap the non-emission area NPXA. The second sensor conductive layer MTL2 may be connected to the first sensor conductive layer MTL1 through a contact hole passing through the first sensor insulation layer ISL2. The second sensor insulation layer ISL3 may be located on the first sensor insulation layer ISL2. The second sensor insulation layer ISL3 may cover the second sensor conductive layer MTL2.

Figure 7:
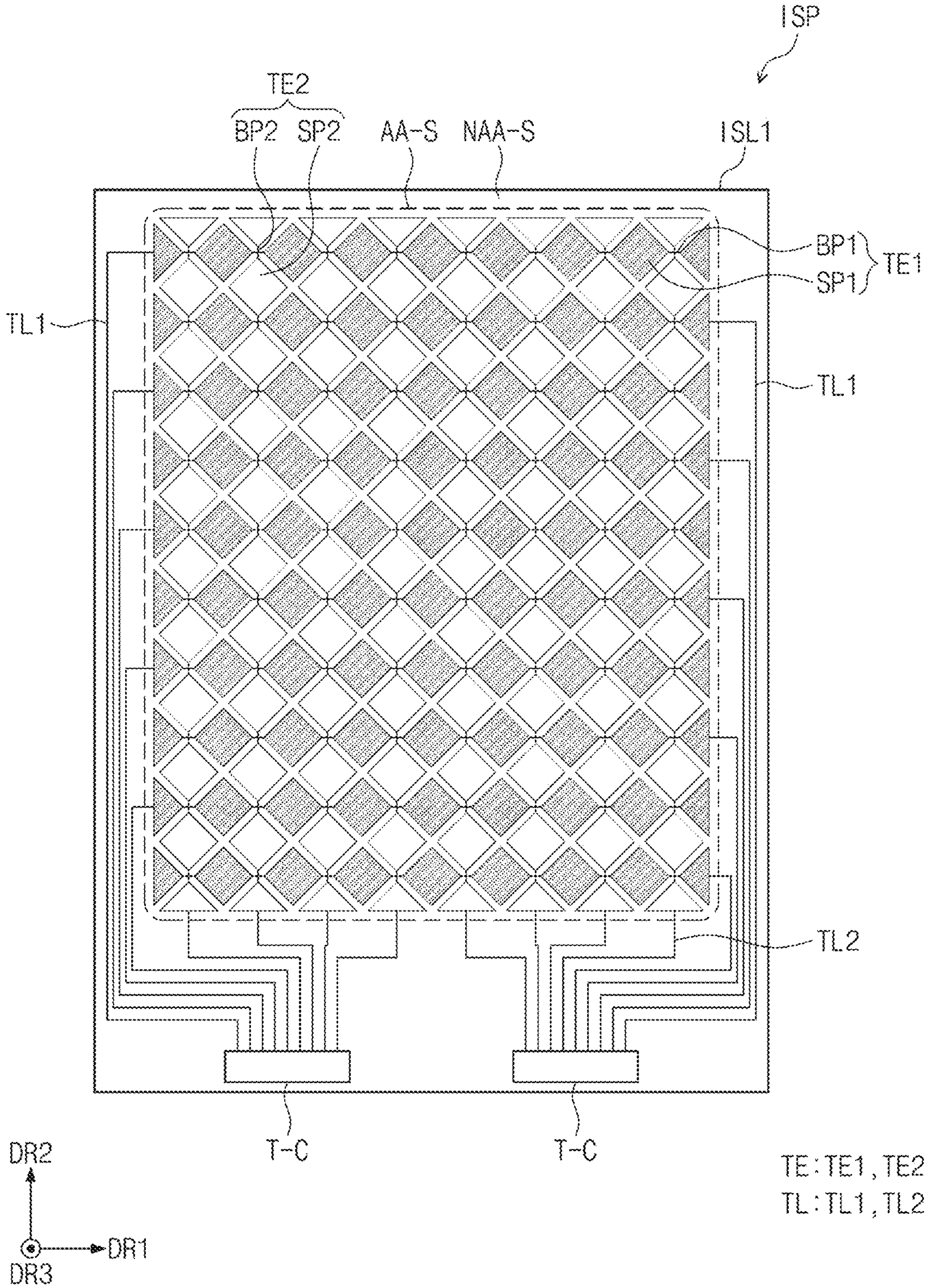
FIG. 7 is a plan view of an input sensor according to some embodiments of the present disclosure.

FIG. 7 is a plan view of an input sensor ISP according to some embodiments of the present disclosure.

Referring to FIG. 7, the input sensor ISP may include a detection area AA-S, and a non-detection area NAA-S adjacent to the detection area AA-S. The detection area AA-S may correspond to the active area AA (see FIG. 2) of the display device DD (see FIG. 2). The detection area AA-S may be an area on which detection electrodes TC of the input sensor ISP are arranged to detect the external input TC (see FIG. 1). The non-detection area NAA-S may correspond to the peripheral area NAA (see FIG. 2) of the display device DD (see FIG. 2). The non-detection area NAA-S may be an area on which lines or elements for driving the detection electrodes TC located in the detection area AA-S are located.

The input sensor ISP may include the detection electrodes TC, trace lines TL (or signal lines), and a sensing controller T-C, which are located on a sensor base layer ISL1.

The detection electrodes TE may include first detection electrodes TE1 and second detection electrodes TE2, which cross each other on a plane (or in a plan view) and are electrically insulated from each other. The input sensor ISP may obtain information of an external input through a variation in capacitance between the first detection electrodes TE1 and the second detection electrodes TE2.

Each of the first detection electrodes TE1 may extend in the first direction DR1, and the first detection electrodes TE1 may be arranged in the second direction DR2. The first detection electrodes TE1 may be provided in a plurality of rows arranged in the second direction DR2. FIG. 7 illustrates ten first detection electrodes TE1 as an example, but the number of the first detection electrodes TE1 included in the input sensor ISP is not limited thereto.

Each of the second detection electrodes TE2 may extend in the second direction DR2, and the second detection electrodes TE2 may be arranged in the first direction DR1. The second detection electrodes TE2 may be provided in a plurality of columns arranged in the first direction DR1. FIG. 7 illustrates eight second detection electrodes TE2 as an example, but the number of the second detection electrodes TE2 included in the input sensor ISP is not limited thereto.

Each of the first detection electrodes TE1 may include first detection patterns SP1 and first connection patterns BP1 (or bridge patterns). The first detection patterns SP1 may be arranged in the first direction DR1. Each of the first connection patterns BP1 may electrically connect the first detection patterns SP1, which are adjacent thereto in the first direction DR1, to each other. The first connection patterns BP1 may be located on a different layer from the first detection patterns SP1, and be connected to the first detection patterns SP1 corresponding thereto through a contact hole. The first detection patterns SP1 spaced apart from each other in the first direction DR1 may be electrically connected to each other through the first connection patterns BP1. The first connection patterns BP1, which are located on a different layer from the first detection patterns SP1 to electrically connect the first detection patterns SP1 to each other, may be defined as bridge patterns.

Each of the second detection electrodes TE2 may include second detection patterns SP2 and second connection patterns BP2. The second detection patterns SP2 may be arranged in the second direction DR2. Each of the second connection patterns BP2 may electrically connect the second detection patterns SP2, which are adjacent thereto in the second direction DR2, to each other. The second connection patterns BP2 may be located on the same layer as the second detection patterns SP2, and extend from the second detection patterns SP2 to have a shape of one body on a plane (or in a plan view). The second detection patterns SP2 and the second connection patterns BP2 may be patterns that are formed by patterning the same conductive layer through the same process. However, embodiments according to the present disclosure are not limited thereto as long as each of the second connection patterns BP2 electrically connects the second detection patterns SP2, which are adjacent thereto in the second direction DR2, to each other.

According to some embodiments, the first detection patterns SP1, the second detection patterns SP2, and the second connection patterns BP2 may be located on the same layer. The first connection patterns BP1 may be located on a different layer from the first detection patterns SP1. For example, the first detection patterns SP1, the second detection patterns SP2, and the second connection patterns BP2 may be included in the second sensor conductive layer MTL2 (see FIG. 4C), and the first connection patterns BP1 may be included in the first sensor conductive layer MTL1 (see FIG. 4C). However, embodiments according to the present disclosure are not limited thereto, and the first detection patterns SP1, the second detection patterns SP2, and the second connection patterns BP2 may be included in the first sensor conductive layer MTL1 (see FIG. 4C), and the first connection patterns BP1 may be included in the second sensor conductive layer MTL2 (see FIG. 4C).

FIG. 7 illustrates aspects of embodiments in which the first connection patterns BP1 are located on a different layer from the first detection patterns SP1, the second detection patterns SP2, and the second connection patterns BP2. However, embodiments according to the present disclosure are not limited thereto.

For example, the second connection patterns BP2 may be located on a different layer from the second detection patterns SP2, and be connected to the second detection patterns SP2 corresponding thereto through a contact hole. The first connection patterns BP1 may be located on the same layer as the first detection patterns SP1, and may extend from the first detection patterns SP1 to have a shape of one body on a plane (or in a plan view). Here, the second connection patterns BP2 may be located on a different layer from each of the first detection patterns SP1, the first connection patterns BP1, and the second detection patterns SP2. Alternatively, according to some embodiments, the first detection patterns SP1, the first connection patterns BP1, and the second detection patterns SP2 may be located on the same layer, and the second connection patterns BP2 may be located on a different layer from the second detection patterns SP2.

The trace lines TL may be located on the non-detection area NAA-S. The trace lines TL may include first trace lines TL1 and second trace lines TL2. The first trace lines TL1 may be connected to the first detection electrodes TE1, respectively. Each of the first trace lines TL1 may be connected to the first detection electrode TE1, which is provided in a row corresponding thereto, of the first detection electrodes TE1 provided in the plurality of rows. The second trace lines TL2 may be connected to the second detection electrodes TE2, respectively. Each of the second trace lines TL2 may be connected to the second detection electrode TE2, which is provided in a column corresponding thereto, of the second detection electrodes TE2 provided in the plurality of columns.

The second trace lines TL2 may be connected to lower ends of the second detection electrodes TE2, respectively, which are adjacent to the sensing controller T-C. Each of the second trace lines TL2 may extend from the lower end of the second detection electrode TE2 corresponding thereto on the non-detection area NAA-S so as to be connected to the sensing controller T-C.

Each of the first trace lines TL1 may be connected to a left end or a right end of each of the first detection electrodes TE1. For example, each of the first trace lines TL1 connected to the first detection electrodes TE1, which are provided in odd-numbered rows, of the first trace lines TL1 may be connected to the left end of the first detection electrode TE1, which corresponds thereto, of the first detection electrodes TE1 provided in the odd-numbered rows. Each of the first trace lines TL1 connected to the first detection electrodes TE1, which are provided in even-numbered rows, of the first trace lines TL1 may be connected to the right end of the first detection electrode TE1, which corresponds thereto, of the first detection electrodes TE1 provided in the even-numbered rows. Each of the first trace lines TL1 may extend from the left or right end of the first detection electrode TE1 corresponding thereto on the non-detection area NAA-S in the second direction DR2 so that the first trace lines TL1 are connected to the sensing controller T-C.

The first trace lines TL1 may be located on a different layer from at least some of the second detection patterns TE2. For example, the first trace lines TL1 may be located on a different layer from the second detection patterns SP2. According to some embodiments, the first trace lines TL1 may be included in the first sensor conductive layer MTL1 (see FIG. 4C), and the second detection patterns SP2 may be included in the second sensor conductive layer MTL2 (see FIG. 4C). However, embodiments according to the present disclosure are not necessarily limited thereto.

The sensing controller T-C may be located on the non-detection area NAA-S. The sensing controller T-C may be arranged to be adjacent to a lower end of the sensor base layer ISL1. The sensing controller T-C may be electrically connected to the trace lines TL. The sensing controller T-C may apply signals to the detection electrodes TE through the trace lines TL, or receive signals provided from the detection electrodes TE. The sensing controller T-C may include a controller, and may generate a coordinate value of information, which is provided with an external input, based on the signals received from the detection electrodes TE. However, embodiments according to the present disclosure are not limited thereto. For example, the sensing controller T-C may include sensing pads that are arranged to be spaced apart from each other and connected to the trace lines TL, respectively, and the sensing pads may be portions that are electrically connected to a circuit board that provides driving signals.

The driving signals for driving the first detection electrodes TE1 and the second detection electrodes TE2 may be applied from the sensing controller T-C to the first detection electrodes TE1 and the second detection electrodes TE2 through the second trace lines TL2. Signals including information detected in the first detection electrodes TE1 and the second detection electrodes TE2 may be output through the first trace lines TL1. However, embodiments according to the present disclosure are not necessarily limited thereto.

Figure 8:
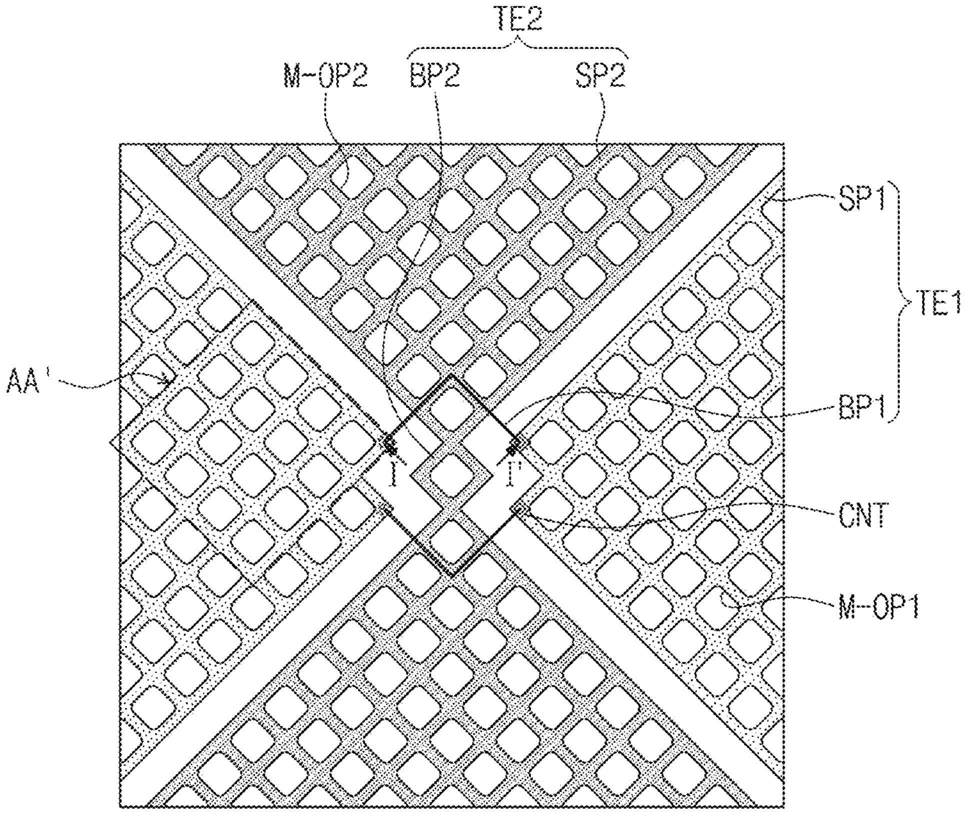
FIG. 8 is an enlarged plan view of first and second detection electrodes according to some embodiments of the present disclosure.

FIG. 8 is an enlarged plan view of first and second detection electrodes TE1 and TE2 according to some embodiments of the present disclosure.

Referring to FIG. 8, each of first detection patterns SP1 may be a mesh pattern in which a first mesh opening portion M-OP1 is defined. The first mesh opening portion M-OP1 may overlap the emission area PXA (see FIG. 6) on a plane (or in a plan view). The first detection patterns SP1 may overlap the non-emission area NPXA (see FIG. 6) on a plane (or in a plan view). Each of second detection patterns SP2 may be a mesh pattern in which a second mesh opening portion M-OP2 is defined. The second mesh opening portion M-OP2 may overlap the emission area PXA (see FIG. 6) on a plane (or in a plan view). The second detection patterns SP2 may overlap the non-emission area NPXA (see FIG. 6) on a plane (or in a plan view).

Each of first connection patterns BP1 may connect the first detection electrodes SP1, which are adjacent thereto, to each other. The first connection patterns BP1 may be connected to the first detection electrodes SP1 through contact holes CNT. The first connection patterns BP1 may overlap the second detection patterns SP2 on a plane (or in a plan view). The first connection patterns BP1 may be located on a different layer from the first detection patterns SP1. The second connection patterns BP2 may be located on the same layer as the second detection patterns SP2.

FIG. 8 illustrates a case in which the first connection patterns BP1 are located a different layer from the first detection patterns SP1 and are connected through the contact holes CNT, and the second connection patterns BP2 are located on the same layer as the second detection patterns SP2. However, embodiments according to the present disclosure are not limited thereto. For example, the second connection patterns BP2 may be located a different layer from the second detection patterns SP2, and be connected through contact holes, and the first connection patterns BP1 may be located on the same layer as the first detection patterns SP1.

Hereinafter, the same structure as the structure of the first connection patterns BP1 and the first detection patterns SP1 connected through the contact holes CNT described herein may apply to the second connection patterns BP2 and the second detection patterns SP2. Hereinafter, descriptions are provided mainly with the structure illustrated in FIG. 8.

Figure 9:
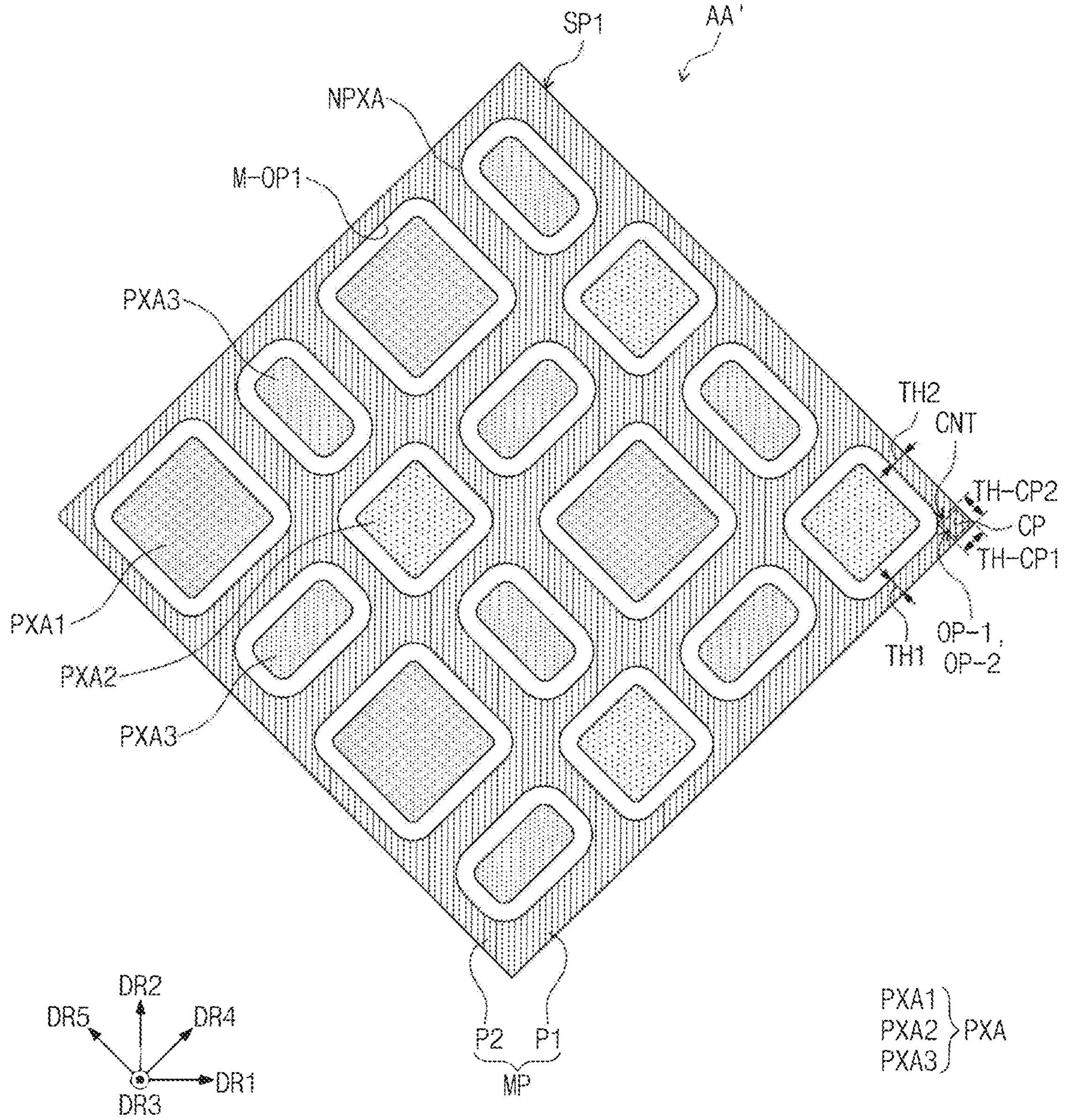
FIG. 9 is a plan view of area AA' in FIG. 8 according to some embodiments of the present disclosure.

FIG. 9 is a plan view of area AA' in FIG. 8 according to some embodiments of the present disclosure. In the present disclosure, a fourth direction DR4 may be a direction crossing each of the first direction DR1 and the second direction DR2 on a plane defined by the first direction DR1 and the second direction DR2. A fifth direction DR5 may be a direction crossing each of the first direction DR1, the second direction DR2, and the fourth direction DR4 on the plane defined by the first direction DR1 and the second direction DR2.

Referring to FIG. 9, an emission area PXA may include a first emission area PXA1, a second emission area PXA2, and a third emission area PXA3. Each of the first to third emission areas PXA1, PXA2 and PXA3 may be provided in plurality. The first emission areas PXA1 and the second emission areas PXA2 may be arranged alternately in each of the first direction DR1 and the second direction DR2. The first emission areas PXA1, and the third emission areas PXA3 extending in the fifth direction DR5 may be arranged alternately in the fourth direction DR4, and the first emission areas PXA1, and the third emission areas PXA3 extending in the fourth direction DR4 may be arranged alternately in the fifth direction DR5. The second emission areas PXA2, and the third emission areas PXA3 extending in the fourth direction DR4 may be arranged alternately in the fourth direction DR4, and the second emission areas PXA2, and the third emission areas PXA3 extending in the fifth direction DR5 may be arranged alternately in the fifth direction DR5.

The first to third emission areas PXA1, PXA2 and PXA3 may emit light having different colors from each other. A surface area of the first emission area PXA1 on a plane (or in a plan view) may be larger than a surface area of the second emission area PXA2 on a plane (or in a plan view). The surface area of the second emission area PXA2 on a plane (or in a plan view) may be larger than a surface area of the third emission area PXA3 on a plane (or in a plan view). The first emission area PXA1 may emit light having a first color, the second emission area PXA2 may emit light having a second color, and the third emission area PXA3 may emit light having a third color. Here, the light having the first color may be blue light, the light having the second color may be red light, and the light having the third color may be green light. However, here, the colors of the light having the first to third colors may be changed.

The emission areas PXA are not limited to the arrangement of the emission areas PXA illustrated in FIG. 9, and may be capable of being variously arranged. For example, the emission areas PXA1, PXA2 and PXA3 may have a pentile (PENTILE™) arrangement shape, or a diamond (Diamond Pixel™) arrangement shape.

The first detection pattern SP1 may include a mesh pattern MP. The mesh pattern MP may include a first line part P1 and a second line part P2. The first line part P1 and the second line part P2 may be connected to each other to have a shape of one body, and define first mesh opening portions M-OP1 overlapping the first to third emission areas PXA1, PXA2 and PXA3, respectively. The first line part P1 and the second line part P2 may be portions provided by patterning a conductive layer provided in the form of one body by using the first mesh opening portions M-OP1. The first line part P1 and the second line part P2 may be located at the non-emission area NPXA to have a shape surrounding the first to third emission areas PXA1, PXA2 and PX3.

The first line part P1 may correspond to a portion, which extends in the fourth direction DR4, of the mesh pattern MP. The second line part P2 may correspond to a portion, which extends in the fifth direction DR5, of the mesh pattern MP. The first line part P1 and the second line part P2 may be arranged while crossing each other on a plane (or in a plan view).

The first line part P1 and the second line part P2 may cross each other at an intersection CP on a plane (or in a plan view). A first width TH-CP1 of the intersection CP in the fourth direction DR4 may be larger than a line width TH2 of the second line part P2 in the fourth direction DR4. A second width TH-CP2 of the intersection CP in the fifth direction DR5 may be larger than a line width TH1 of the first line part P1 in the fifth direction DR5. A contact hole CNT may be located in the intersection CP on a plane (or in a plan view). As the contact hole CNT is located in the intersection CP having a relatively large surface area compared to the first line part P1 and the second line part P2, the contact hole CNT may be provided to be as large as possible in surface area. In addition, as the contact hole CNT is located in the intersection CP having a large surface area, even when a mask is misaligned during forming of the contact hole CNT, damage to another layer may not be caused.

A shape of each of a first opening portion OP-1 and a second opening portion OP-2 on a plane (or in a plan view) may correspond to a shape of the contact hole CNT on a plane (or in a plan view). The first opening portion OP-1 and the second opening portion OP-2 will be described in more detail later with reference to FIG. 11.

A shape of the first mesh opening portion M-OP1 on a plane (or in a plan view) may correspond to a shape of each of the first to third emission areas PXA1, PXA2 and PXA3 on a plane (or in a plan view). The shape of the first mesh opening portion M-OP1 on a plane may (or in a plan view) be larger than the corresponding shape of each of the first to third emission areas PXA1, PXA2 and PXA3 on a plane (or in a plan view). One side surface of the first mesh opening portion M-OP1 may be spaced a gap (e.g., a set or a predetermined gap) from one side surface of the emission area PXA corresponding to the first mesh opening portion M-OP1 on a plane (or in a plan view).

Figure 10:
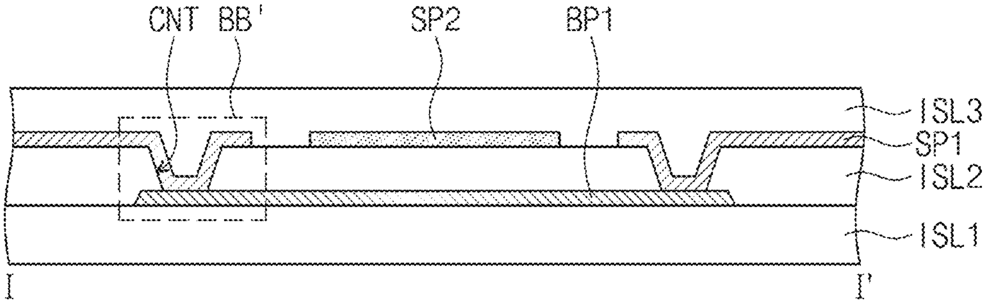
FIG. 10 is a cross-sectional view corresponding to line I-I' in FIG. 8 according to some embodiments of the present disclosure.

FIG. 10 is a cross-sectional view corresponding to line I-I' in FIG. 8 according to some embodiments of the present disclosure.

Referring to FIG. 10, the first connection pattern BP1 may be located on a sensor base layer ISL1. the first detection pattern SP1 and the second detection pattern SP2 may be located on a first sensor insulation layer ISL2. A second sensor insulation layer ISL3 may cover the first detection pattern SP1 and the second detection pattern SP2.

The first detection pattern SP1 may be electrically connected to the first connection pattern BP1 through a contact hole CNT passing through the first sensor insulation layer ISL2. A portion of the first connection pattern BP1 may overlap the second detection pattern SP2 on a plane (or in a plan view). The first connection pattern BP1 located on the sensor base layer ISL1 may be the first sensor conductive layer MTL1 (see FIG. 6). The first detection pattern SP1 and the second detection pattern SP2, which are located on the first sensor insulation layer ISL2, may be the second sensor conductive layer MTL2 (see FIG. 6). However, the layer structure illustrated in FIG. 10 is an example, and the layer structure is not limited thereto. For example, the first connection pattern BP1 may be located on the first sensor insulation layer ISL2, and the first detection pattern SP1 and the second detection pattern SP2 may be located on the sensor base layer ISL1. Here, the first connection pattern BP1 may be the second sensor conductive layer MTL2 (see FIG. 6), and the first detection pattern SP1 and the second detection pattern SP2 may be the first sensor conductive layer MTL1 (see FIG. 6).

Figure 11:
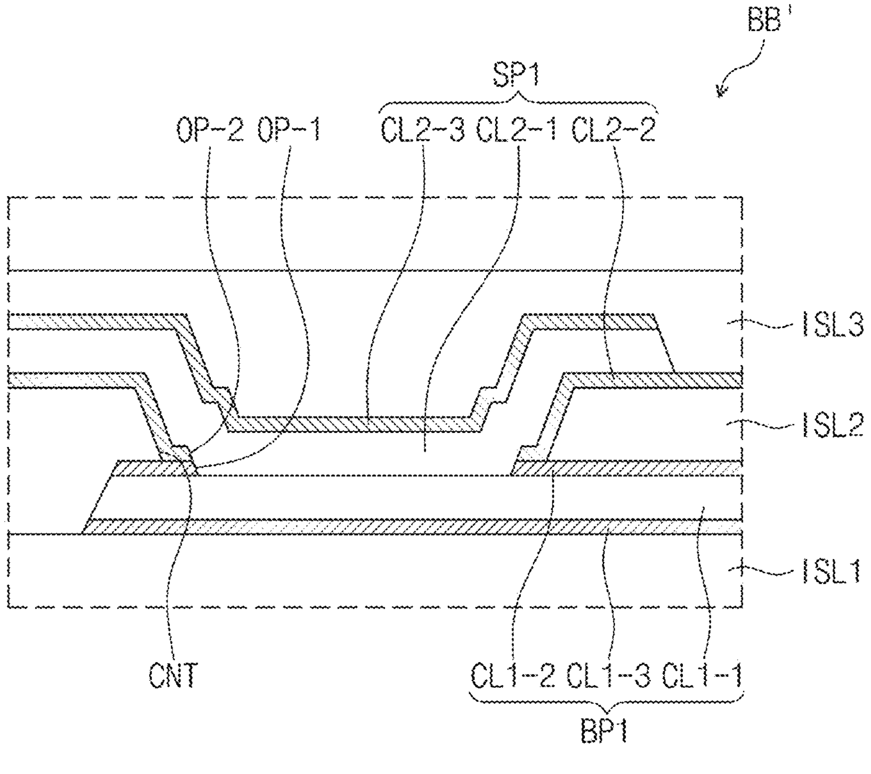
FIG. 11 is a cross-sectional view of area BB' in FIG. 10 according to some embodiments of the present disclosure.

FIG. 11 is a cross-sectional view of area BB' in FIG. 10 according to some embodiments of the present disclosure. FIG. 11 illustrates a layer structure and a connection structure of the first detection pattern SP1 and the first connection pattern BP1.

Referring to FIG. 11, the first connection pattern BP1 may include a (1-1)-th conductive layer CL1-1, a (1-2)-th conductive layer CL1-2, and a (1-3)-th conductive layer CL1-3. The (1-2)-th conductive layer CL1-2 may be located directly on one surface of the (1-1)-th conductive layer CL1-1, and the (1-3)-th conductive layer CL1-3 may be located directly on the other surface of the (1-1)-th conductive layer CL1-1. The (1-2)-th conductive layer CL1-2 may be located directly on a top surface of the (1-1)-th conductive layer CL1-1, and the (1-3)-th conductive layer CL1-3 may be located directly on a bottom surface of the (1-1)-th conductive layer CL1-1. The first connection pattern BP1 may have a three-layer structure in which the (1-3)-th conductive layer CL1-3, the (1-1)-th conductive layer CL1-1, and the (1-2)-th conductive layer CL1-2 are stacked in sequence.

The first detection pattern SP1 may include a (2-1)-th conductive layer CL2-1, a (2-2)-th conductive layer CL2-2, and a (2-3)-th conductive layer CL2-3. The (2-2)-th conductive layer CL2-2 may be located directly on one surface of the (2-1)-th conductive layer CL2-1, and the (2-3)-th conductive layer CL2-3 may be located directly on the other surface of the (2-1)-th conductive layer CL2-1. The (2-2)-th conductive layer CL2-2 may be located directly on a bottom surface of the (2-1)-th conductive layer CL2-1, and the (2-3)-th conductive layer CL2-3 may be located directly on a top surface of the (2-1)-th conductive layer CL2-1. The first detection pattern SP1 may have a three-layer structure in which the (2-2)-th conductive layer CL2-2, the (2-1)-th conductive layer CL2-1, and the (2-3)-th conductive layer CL2-3 are stacked in sequence.

The contact hole CNT may be defined in an inner surface of the first sensor insulation layer ISL2. A first opening portion OP-1 that exposes the top surface of the (1-1)-th conductive layer CL1-1 may be defined in the (1-2)-th conductive layer CL1-2. A second opening portion OP-2 that exposes the bottom surface of the (2-1)-th conductive layer CL2-1 may be defined in the (2-2)-th conductive layer CL2-2. The contact hole CNT and the first and second opening portions OP1 and OP2 may be provided using the same mask. The first opening portion OP-1 and the second opening portion OP-2 may be formed simultaneously through the same process. This will be described later with reference to FIGS. 13A to 13J.

Each of the first opening portion OP-1 and the second opening portion OP-2 may overlap on the contact hole CNT on a plane (or in a plan view). A shape of the first opening portion OP-1 on a plane (or in a plan view) may correspond to a shape of the second opening portion OP-2 on a plane (or in a plan view). The shape of each of the first opening portion OP-1 and the second opening portion OP-2 on a plane (or in a plan view) may correspond to the shape of the contact hole CNT on a plane (or in a plan view). This is because the contact hole CNT and the first and second opening portions OP-1 and OP-2 are provided using the same mask.

One surface of the (1-1)-th conductive layer CL1-1 and one surface of the (2-1)-th conductive layer CL2-1, each of which overlaps the first opening portion OP-1 and the second opening portion OP-2, may be in direct contact with each other. The bottom surface of the (2-1)-th conductive layer CL2-1, which is exposed by the second opening portion OP-2, may be in direct contact with which the top surface of the (1-1)-th conductive layer CL1-1, which is exposed by the first opening portion OP-1. Here, a resistance value of the (1-1)-th conductive layer CL1-1 may be less than a resistance value of the (1-2)-th conductive layer CL1-2. A resistance value of the (2-1)-th conductive layer CL2-1 may be less than a resistance value of the (2-2)-th conductive layer CL2-2. For example, each of the (1-1)-th conductive layer CL1-1 and the (2-1)-th conductive layer CL2-1 may include aluminum or copper. The (1-2)-th conductive layer CL1-2, the (1-3)-th conductive layer CL1-3, the (2-2)-th conductive layer CL2-2, and the (2-3)-th conductive layer CL2-3 may include titanium.

When the first detection pattern SP1 is connected to the first connection pattern BP1, the (1-1)-th conductive layer CL1-1 and the (2-1)-th conductive layer CL2-1 each having low resistance may be in direct contact with each other, not through the (1-2)-th conductive layer CL1-2 or the (2-2)-th conductive layer CL2-2 each having high resistance. Accordingly, when the first detection pattern SP1 and the first connection pattern BP1 are connected through the contact hole CNT, the resistance may be greatly reduced. Accordingly, a total resistance of the input sensor ISP (see FIG. 7) may be relatively reduced, signal delay may be relatively reduced, and sensing performance may be relatively improved.

Figure 12:
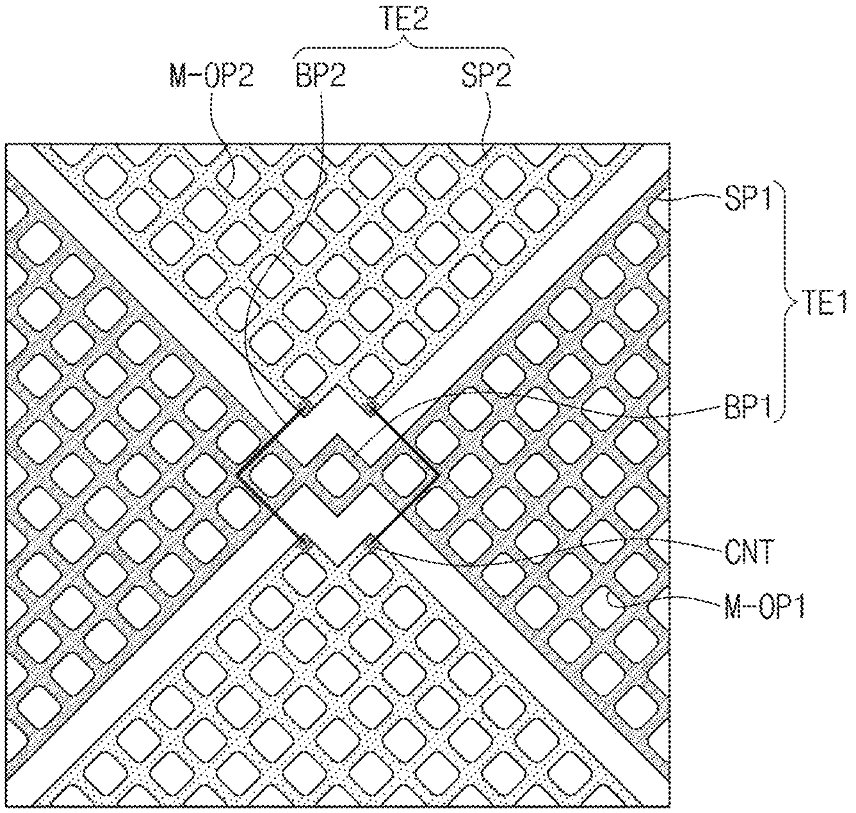
FIG. 12 is an enlarged plan view of first and second detection electrodes according to some embodiments of the present disclosure.

FIG. 12 is an enlarged plan view of first and second detection electrodes TE1 and TE2 according to some embodiments of the present disclosure. Hereinafter, the same/similar components as/to those described with reference to FIG. 8 are designated by the same/similar reference symbols, and descriptions thereof will be simplified or omitted.

Referring to FIG. 12, the first detection electrode TE1 may include first detection patterns SP1 and first connection patterns BP1. The first detection patterns SP1 and the first connection patterns BP1 may be located on the same layer, and provided in the form of one body.

The second detection electrode TE2 may include second detection patterns SP2 and second connection patterns BP2. The second connection patterns BP2 may be located on a different layer from the second detection patterns SP2. The second connection patterns BP2 may be electrically connected to the second detection patterns SP2 through a contact hole CNT. The second connection patterns BP2 may be located on a different layer from the first detection patterns SP1, and some of the second connection patterns BP2 may overlap the first detection patterns SP1 on a plane (or in a plan view).

FIGS. 13A to 13J are each a cross-sectional view illustrating a portion of a method for manufacturing a display device according to some embodiments of the present disclosure. Hereinafter, the same/similar components as/to those described above will be omitted.

Figure 13A:
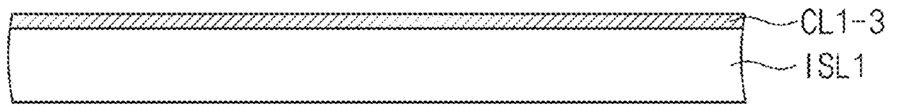
FIGS. 13A to 13J are each a cross-sectional view illustrating a portion of a method for manufacturing a display device according to some embodiments of the present disclosure.
Figure 13B:
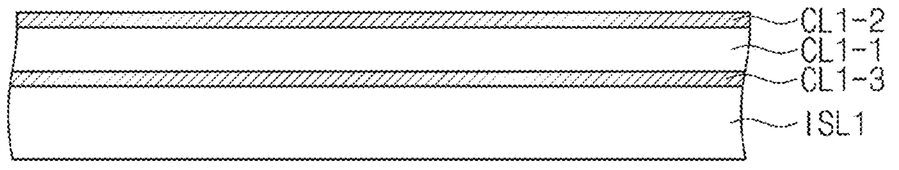

Referring to FIGS. 13A and 13B, a (1-3)-th conductive layer CL1-3, a (1-1)-th conductive layer CL1-1, and a (1-2)-th conductive layer CL1-2 may be formed in sequence on a sensor base layer ISL1.

Figure 13C:
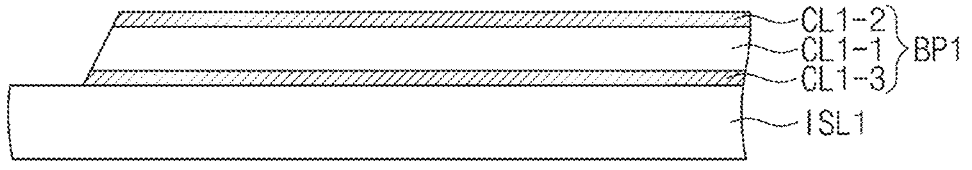
Figure 13D:
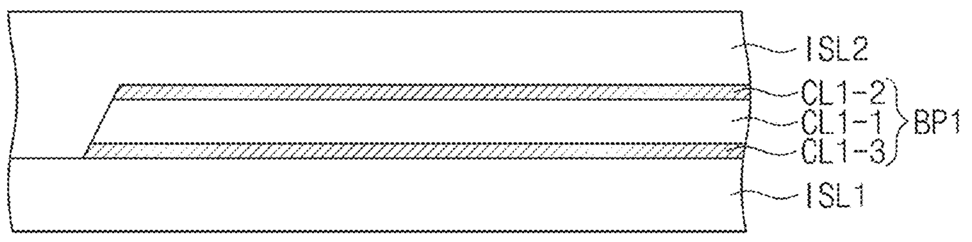

Referring to FIG. 13C, the (1-1)-th to (1-3)-th conductive layers CL1-1 to CL1-3 may be etched to form a first connection pattern BP1 (or first sensor conductive layer) including the (1-1)-th to (1-3)-th conductive layers CL1-1 to CL1-3. Referring to FIG. 13D, a first sensor insulation layer ISL2 that covers the first connection pattern BP1 may be formed.

Figure 13E:
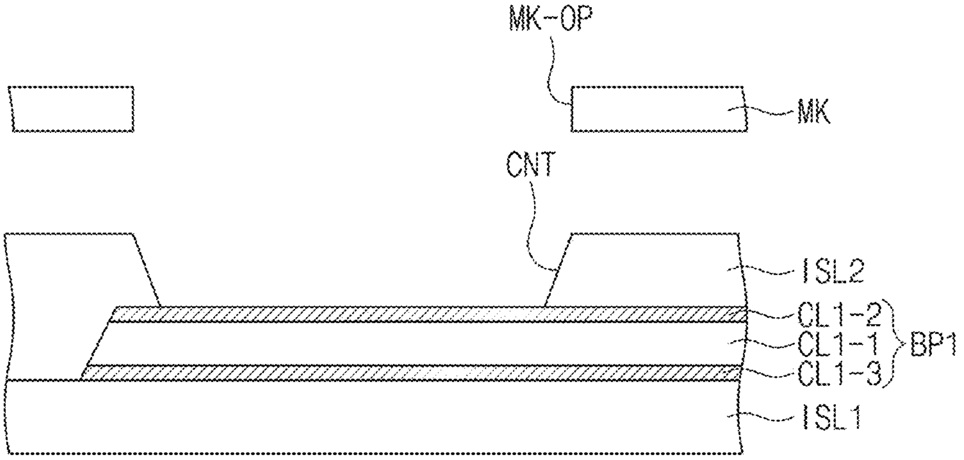

Referring to FIG. 13E, a contact hole CNT that exposes a portion of the (1-2)-th conductive layer CL1-2 may be formed in the first sensor insulation layer ISL2. Here, a mask MK in which a mask opening portion MK-OP corresponding to the contact hole CNT is defined may be utilized.

Figure 13F:
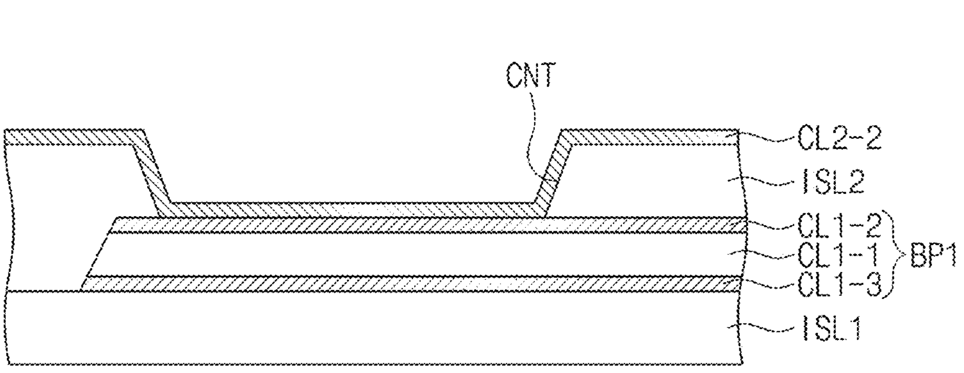

Referring to FIG. 13F, a (2-2)-th conductive layer CL2-2 may be formed on the first sensor insulation layer ISL2 and a top surface of the (1-2)-th conductive layer Cl1-2, which is exposed.

Figure 13G:
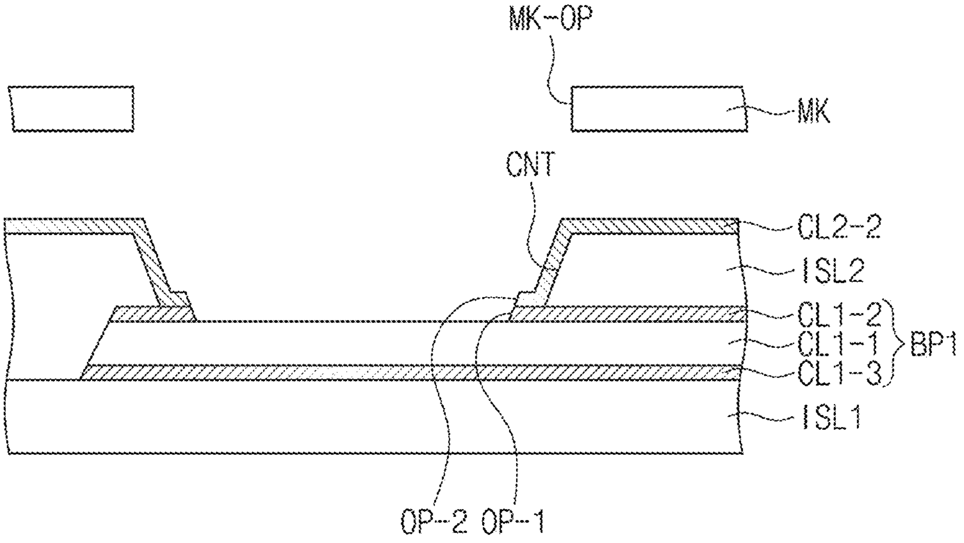

Referring to FIG. 13G, a first opening portion OP-1 overlapping the contact hole CNT may be formed in the (1-2)-th conductive layer Cl1-2. A second opening portion OP-2 overlapping the contact hole CNT may be formed in the (2-2)-th conductive layer Cl2-2. Here, the first and second opening portions OP-1 and OP-2 may be formed using the same mask as the mask MK, in which the mask opening portion MK-OP is defined, described with reference to FIG. 13E. As the same mask is used in the etching processes in FIGS. 13E and 13G, mask costs may be relatively reduced.

Figure 13H:
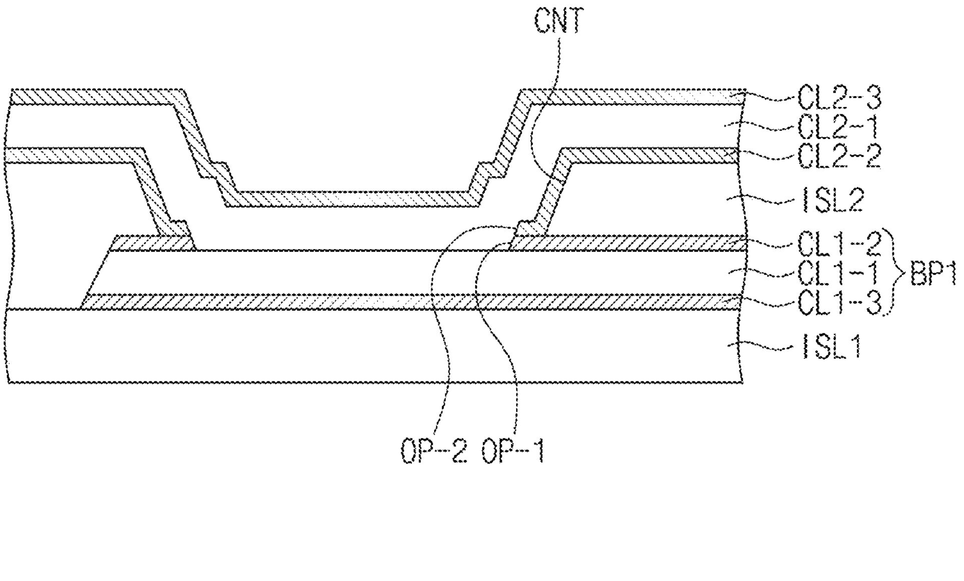
Figure 13I:
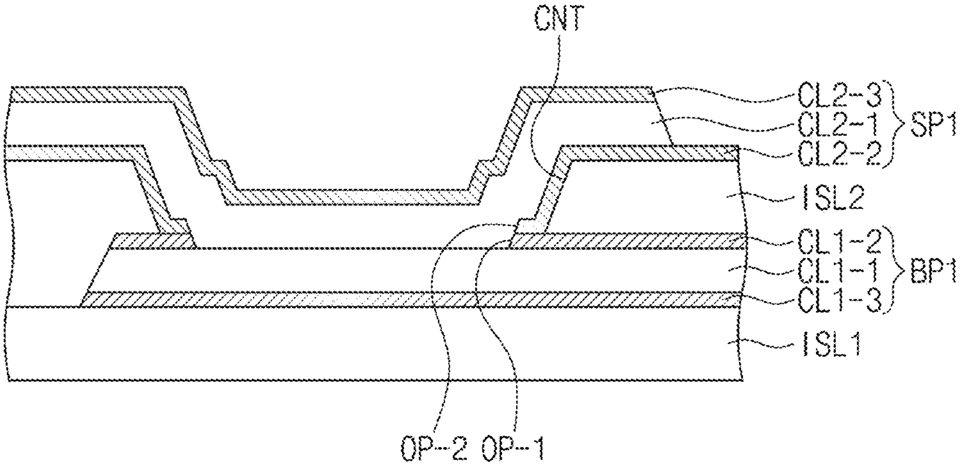

Referring to FIGS. 13H and 13I, a (2-1)-th conductive layer CL2-1 may be formed on the (2-2)-th conductive layer CL2-2 and a top surface of the (1-1)-th conductive layer Cl1-1, which is exposed. The top surface of the (1-1)-th conductive layer CL1-1 and a bottom surface of the (2-1)-th conductive layer CL2-1, each of which overlaps the first opening portion OP-1 and the second opening portion OP-2, may be in contact with each other. A (2-3)-th conductive layer CL2-3 located directly on the (2-1)-th conductive layer CL2-1 may be formed. Thereafter, the (2-1)-th to (2-3)-th conductive layers CL2-1 to CL2-3 may be etched to form a first detection pattern SP1 (or second sensor conductive layer).

Figure 13J:
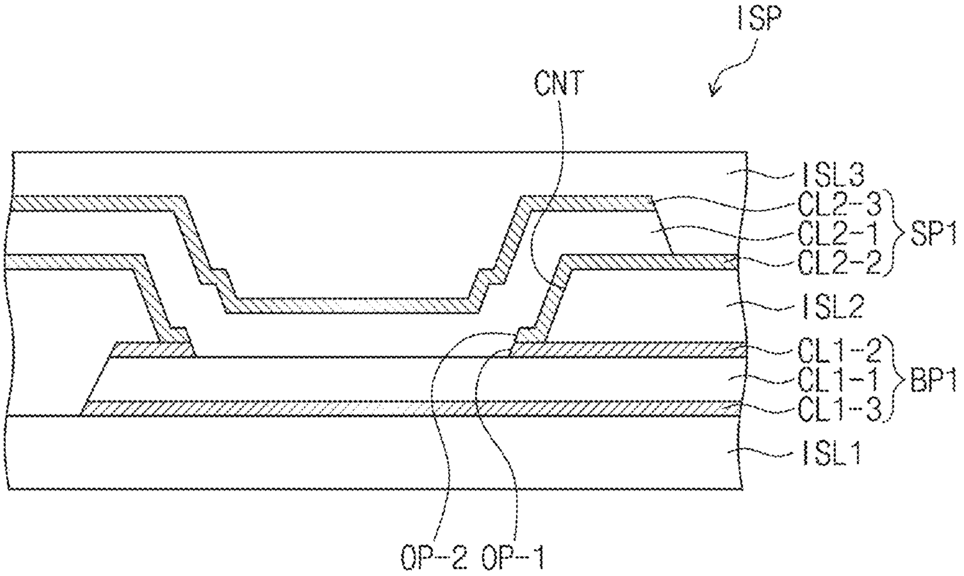

Referring to FIG. 13J, a second sensor insulation layer ISL3 that covers the first detection pattern SP1 may be formed to form an input sensor ISP.

In the display device according to some embodiments of the present disclosure, when the detection patterns are connected through the bridge, the conductive layer having high resistance may be provided to be in contact with the conductive layer having low resistance. Accordingly, the total resistance of the input sensor may be relatively reduced, and the sensing performance of the input sensor may be relatively improved.

In the method for manufacturing the display device according to some embodiments of the present disclosure, when the opening portion is formed in the conductive layer, the same mask as the mask having previously used for forming the contact hole may be used to simplify the manufacture process.

Although the embodiments of the present invention have been described, it is understood that the present invention should not be limited to these embodiments but various changes and modifications can be made by one ordinary skilled in the art within the spirit and scope of the present invention as hereinafter claimed. Therefore, the technical scope of the inventive concept is not limited to the contents described in the detailed description of the specification, but should be determined by the appended claims and their equivalents.

What is claimed is:

1. A display device comprising:

a display panel; and an input sensor directly on the display panel, wherein the input sensor comprises:

a sensor base layer;

a first sensor conductive layer on the sensor base layer;

a sensor insulation layer on the sensor base layer covering the first sensor conductive layer; and a second sensor conductive layer on the sensor insulation layer, and electrically connected to the first sensor conductive layer through a contact hole passing through the sensor insulation layer, wherein the first sensor conductive layer comprises a (1-1)-th conductive layer, a (1-2)-th conductive layer directly on one surface of the (1-1)-th conductive layer, and a (1-3)-th conductive layer directly on the other surface of the (1-1)-th conductive layer, and the second sensor conductive layer comprises a (2-1)-th conductive layer, a (2-2)-th conductive layer directly on one surface of the (2-1)-th conductive layer, and a (2-3)-th conductive layer directly on the other surface of the (2-1)-th conductive layer, wherein a first opening portion exposing the one surface of the (1-1)-th conductive layer is defined in the (1-2)-th conductive layer, and a second opening portion exposing the one surface of the (2-1)-th conductive layer is defined in the (2-2)-th conductive layer, wherein the one surface of the (1-1)-th conductive layer overlapping the first opening portion and the one surface of the (2-1)-th conductive layer overlapping the second opening portion, are in contact with each other.

2. The display device of claim 1, wherein each of the first opening portion and the second opening portion overlaps the contact hole in a plan view.

3. The display device of claim 1, wherein a resistance value of the (1-1)-th conductive layer is less than a resistance value of the (1-2)-th conductive layer, and a resistance value of the (2-1)-th conductive layer is less than a resistance value of the (2-2)-th conductive layer.

* * * * *